United States Patent
Lee et al.

(10) Patent No.: US 12,191,155 B2
(45) Date of Patent: Jan. 7, 2025

(54) SEMICONDUCTOR STRUCTURES AND METHOD FOR MANUFACTURING THE SAME

(71) Applicant: TAIWAN SEMICONDUCTOR MANUFACTURING COMPANY LTD., Hsinchu (TW)

(72) Inventors: Hsin-Yuan Lee, Hsinchu (TW); Chih-Min Hsiao, Taoyuan (TW); Chien-Wen Lai, Hsinchu (TW); Shih-Ming Chang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 542 days.

(21) Appl. No.: 17/573,998

(22) Filed: Jan. 12, 2022

(65) Prior Publication Data

US 2023/0154759 A1 May 18, 2023

Related U.S. Application Data

(60) Provisional application No. 63/280,296, filed on Nov. 17, 2021.

(51) Int. Cl.
  *H01L 21/308* (2006.01)
  *H01L 21/311* (2006.01)
  *H01L 21/762* (2006.01)

(52) U.S. Cl.
  CPC ..... *H01L 21/3086* (2013.01); *H01L 21/31116* (2013.01); *H01L 21/31122* (2013.01); *H01L 21/76224* (2013.01)

(58) Field of Classification Search
  CPC .................................................... H01L 21/3086
  See application file for complete search history.

(56) References Cited

U.S. PATENT DOCUMENTS

| 10,304,744 | B1* | 5/2019 | Joseph ................ H01L 21/0228 |
| 2020/0373413 | A1* | 11/2020 | Song ................... H01L 21/0332 |
| 2020/0386685 | A1* | 12/2020 | Cheng ....................... G01J 3/44 |

* cited by examiner

*Primary Examiner* — William A Harriston
(74) *Attorney, Agent, or Firm* — WPAT LAW; Anthony King

(57) ABSTRACT

The present disclosure provides a method of manufacturing a semiconductor structure. The method includes providing a substrate; depositing a mask layer over the substrate; forming a mandrel pattern over the mask layer; forming a spacer pattern around the mandrel pattern; removing the mandrel pattern; and applying at least one directional etching operation along a first direction to etch two opposing ends of the spacer pattern and form a first spacer feature and a second spacer feature apart from each other.

20 Claims, 43 Drawing Sheets

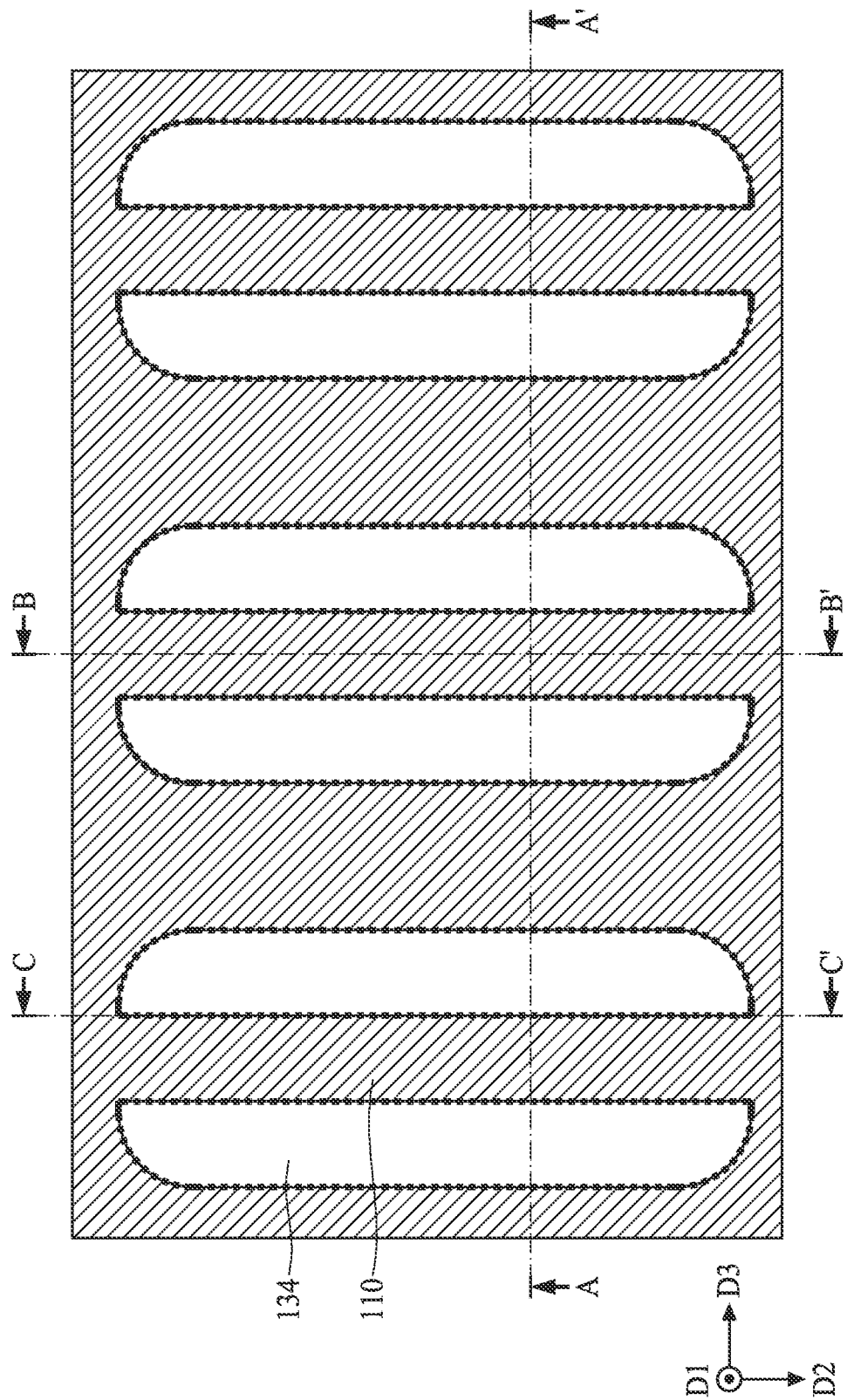

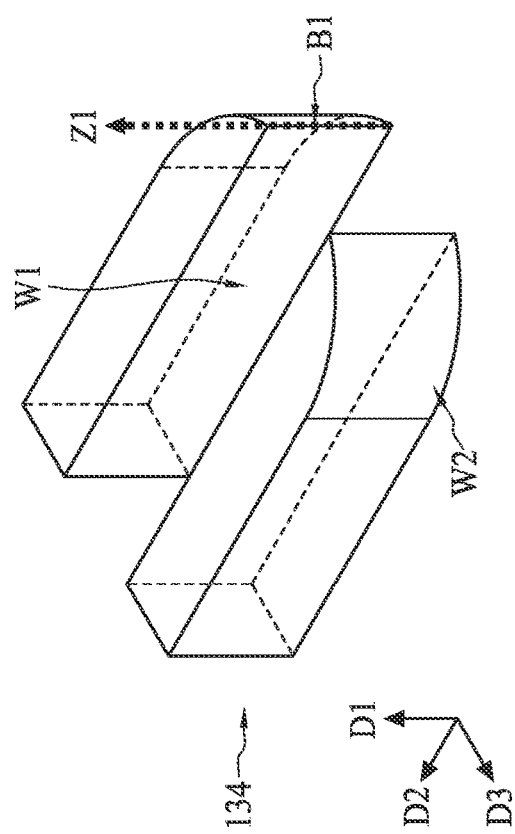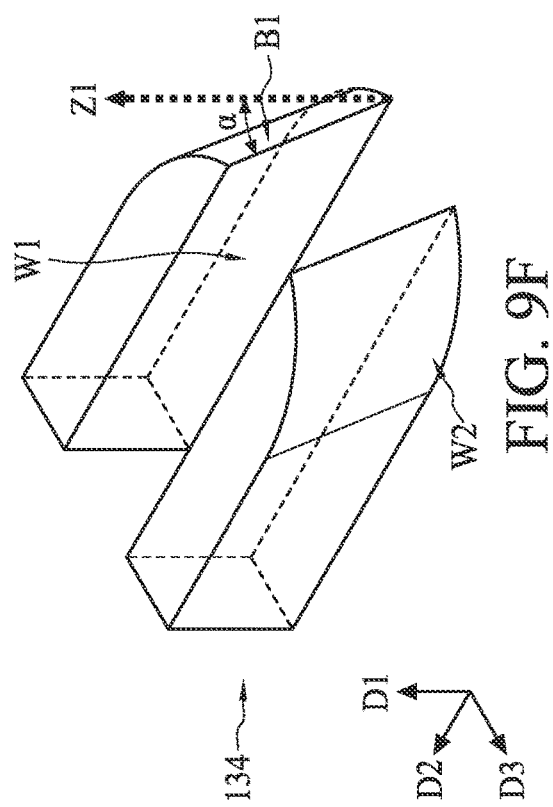

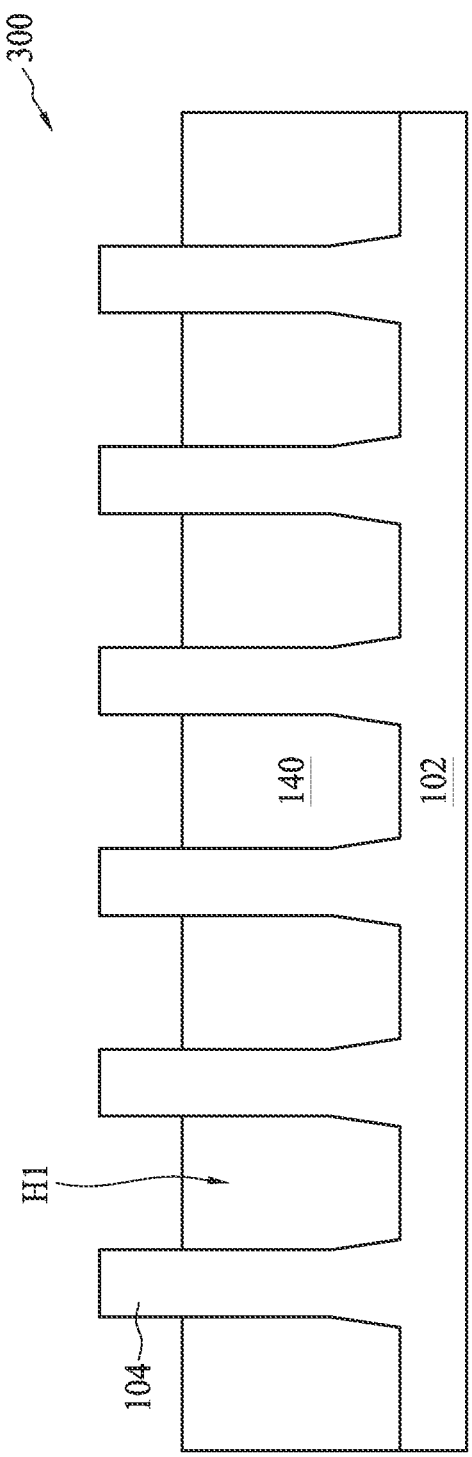
FIG. 14B
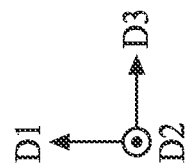

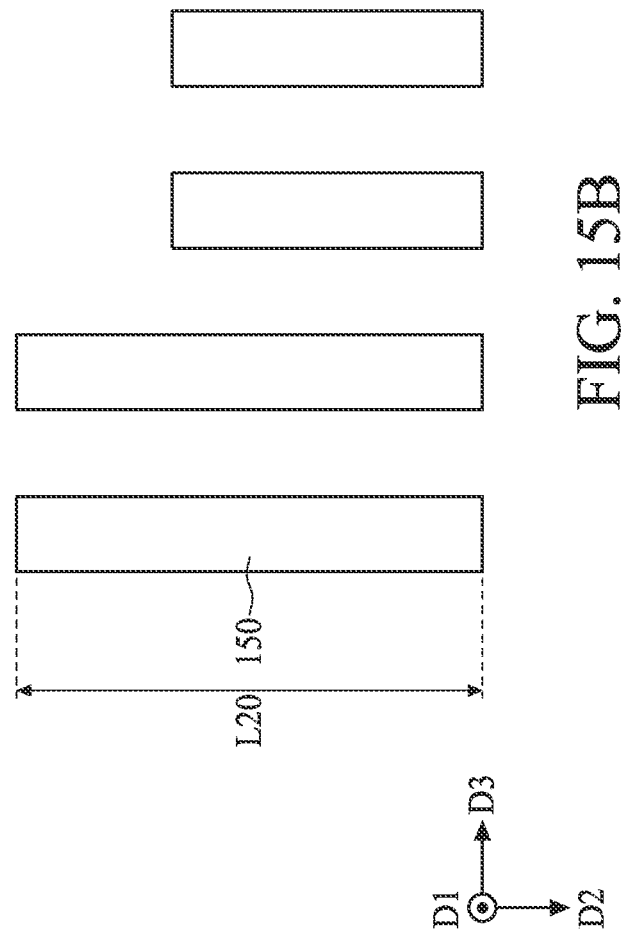

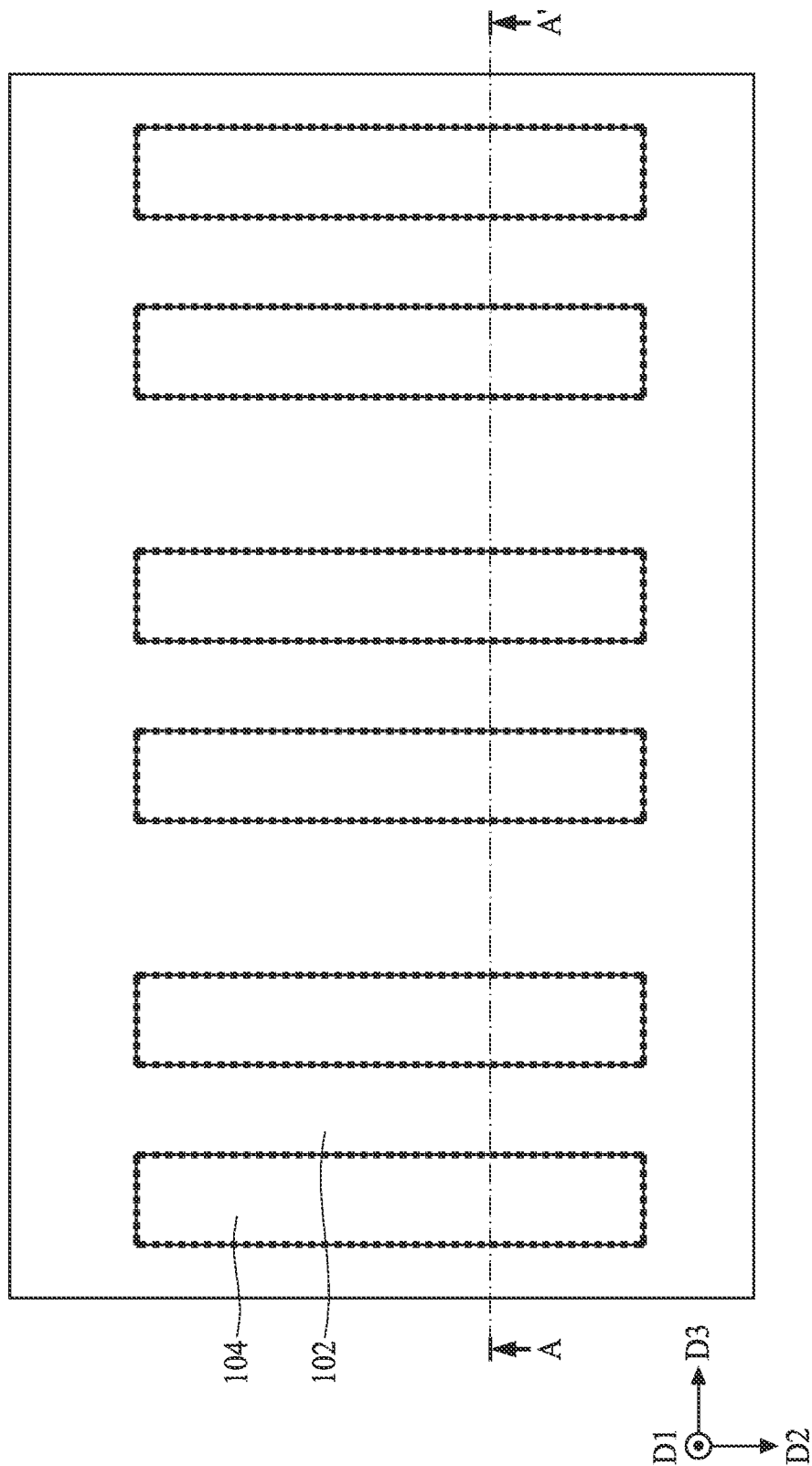

SEMICONDUCTOR STRUCTURES AND METHOD FOR MANUFACTURING THE SAME

PRIORITY CLAIM AND CROSS-REFERENCE

This application claims priority to U.S. Provisional Application No. 63/280,296 filed Nov. 17, 2021, the disclosures of which are hereby incorporated by reference in its entirety.

BACKGROUND

The semiconductor industry has continually improved the speed and power of integrated circuits (ICs) by reducing the size of components (e.g., transistor devices) within the ICs. The ability to reduce the size of components within an integrated chip is usually determined by the lithographic resolution. For example, double patterning lithography (DPL) has become one of the most promising lithography technologies for printing critical design layers in sub-28 nm technology nodes. In recent years, self-aligned double patterning (SADP) has emerged as a double patterning technology that is able to avoid such misalignment and overlay errors. In the SADP technology, mandrels are formed, followed by the formation of spacers along sidewalls of the mandrels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, the dimensions of the various features may be arbitrarily increased or reduced for clarity of discussion.

FIGS. 2A, 7D, 7E, 8D, 8E, 9E and 9F are schematic perspective views of a stacked structure in different stages of some operations of the method shown in FIG. 1, in accordance with some embodiments of the present disclosure.

FIGS. 2B, 3B, 4B, 5B, 5C, 6B, 6C, 7B, 8B, 9C, 9D, 9G, 10B, 11B, 12B, 13B and 14B are schematic cross-sectional views illustrating different stages of sequential operations of the method shown in FIG. 1, in accordance with some embodiments of the present disclosure.

FIGS. 3A, 4A, 5A, 6A, 7A, 7C, 8A, 8C, 9A, 9B, 10A, 11A, 12A, 13A and 14A are schematic top views illustrating different stages of sequential operations of the method shown in FIG. 1, in accordance with some embodiments of the present disclosure.

FIGS. 15A and 15B are schematic top views illustrating various applications of a directional etching operation, in accordance with some embodiments of the present disclosure.

FIGS. 16A, 16B, 17A, 17B, 18A and 18B are schematic top views illustrating multiple directional etching operations applied in the method shown in FIG. 1, in accordance with some embodiments of the present disclosure.

DETAILED DESCRIPTION

Figure 1:
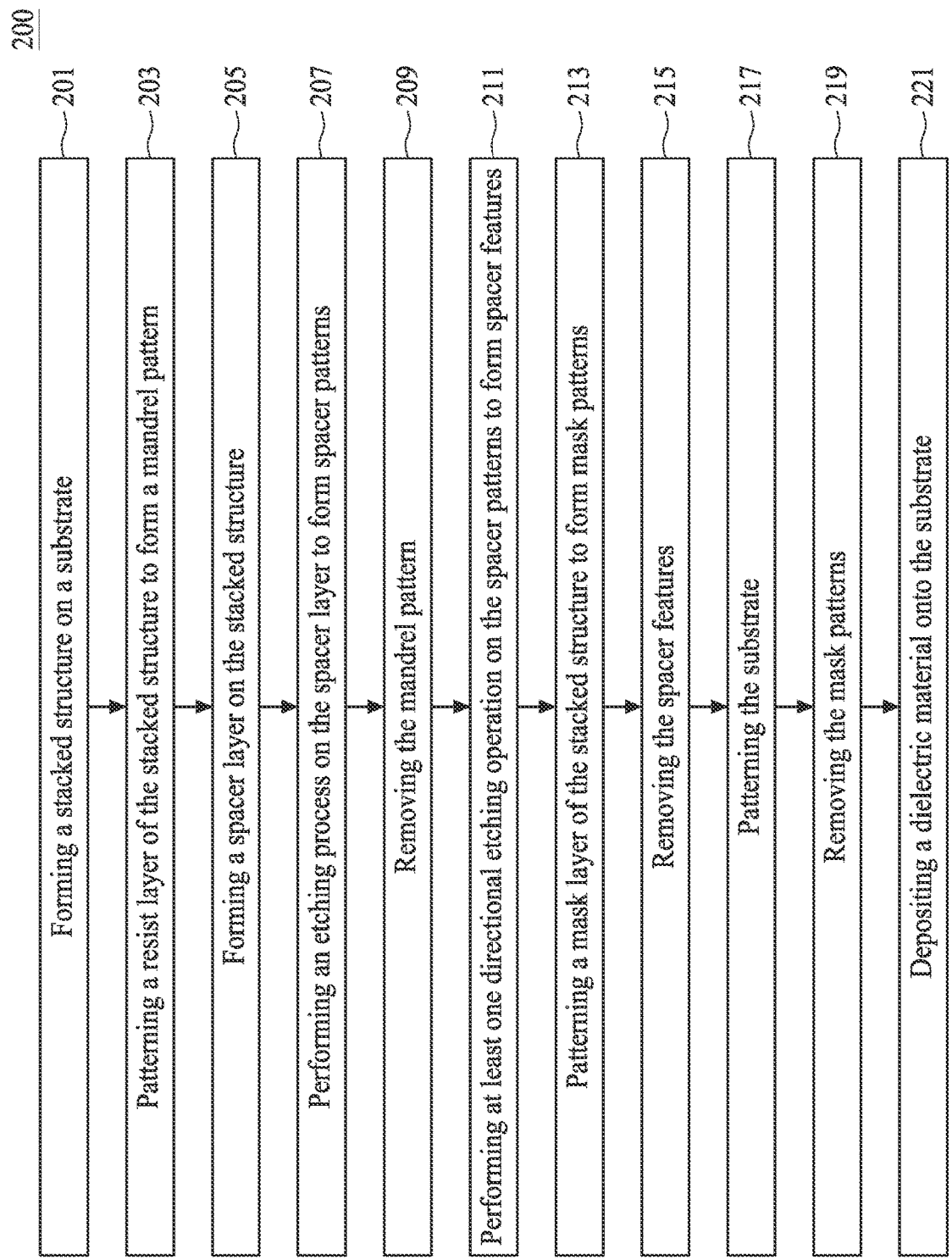
FIG. 1 is a flow diagram showing a method of fabricating a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is directed to a patterning process for semiconductor structure. Specifically, the SADP technology is introduced in which mandrels are patterned, followed by the formation of spacers along sidewalls of the mandrels. The mandrels are removed while the spacers remain and are used to define a pattern at about half a pitch of the mandrels. The abovementioned patterning process may be performed to pattern lines in a semiconductor structure. The lines patterned in this way may attain a pitch that is difficult to achieve using existing lithographic equipment alone.

Figure 13A:
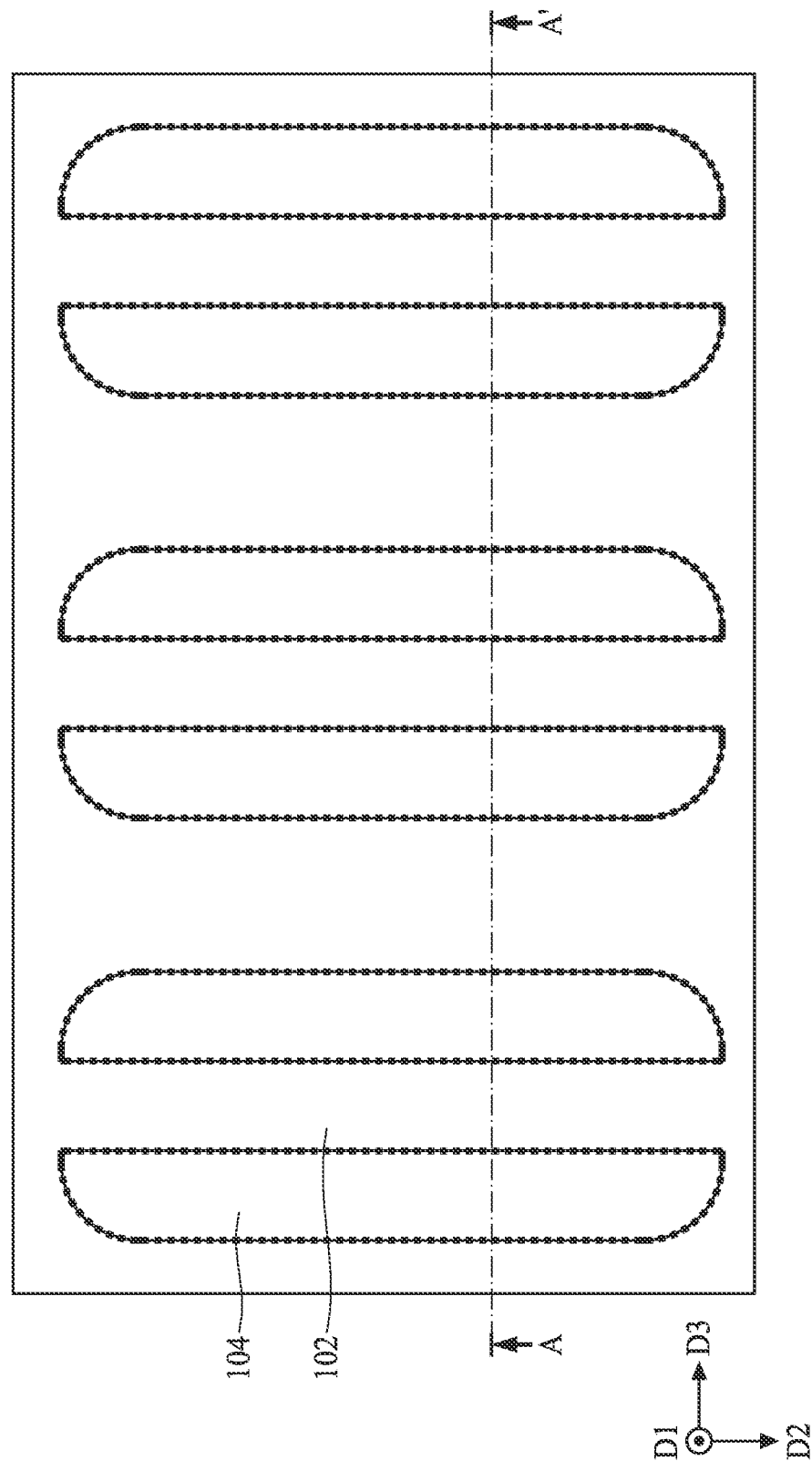
Figure 13B:
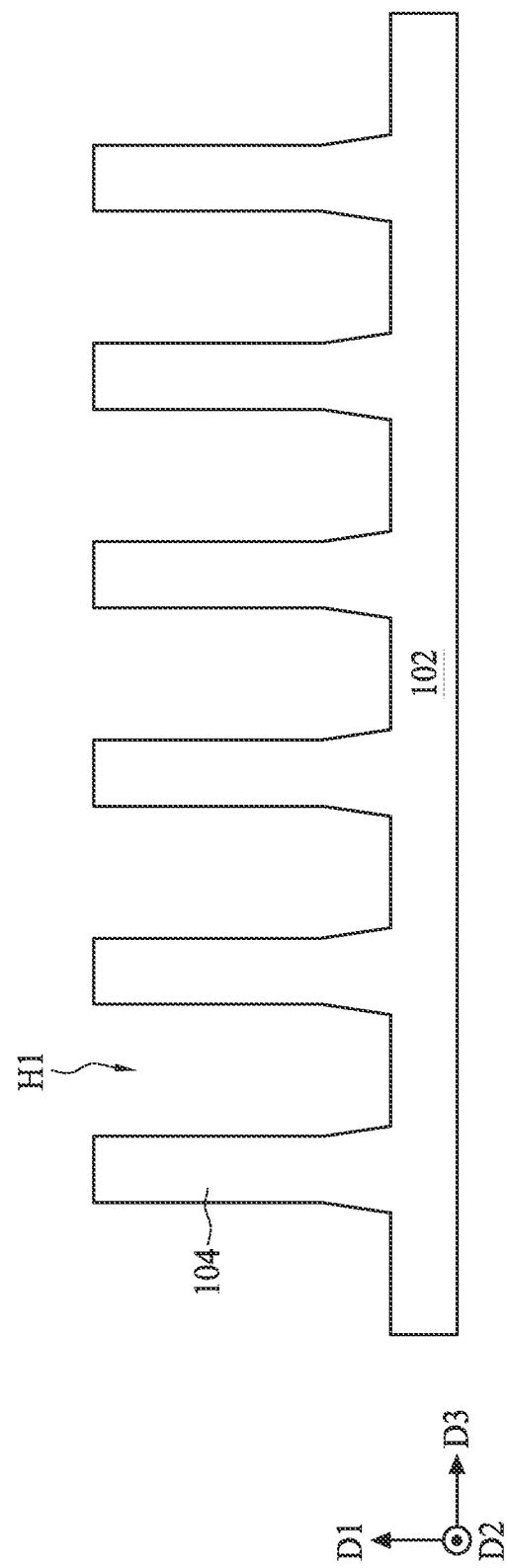
Figure 14A:
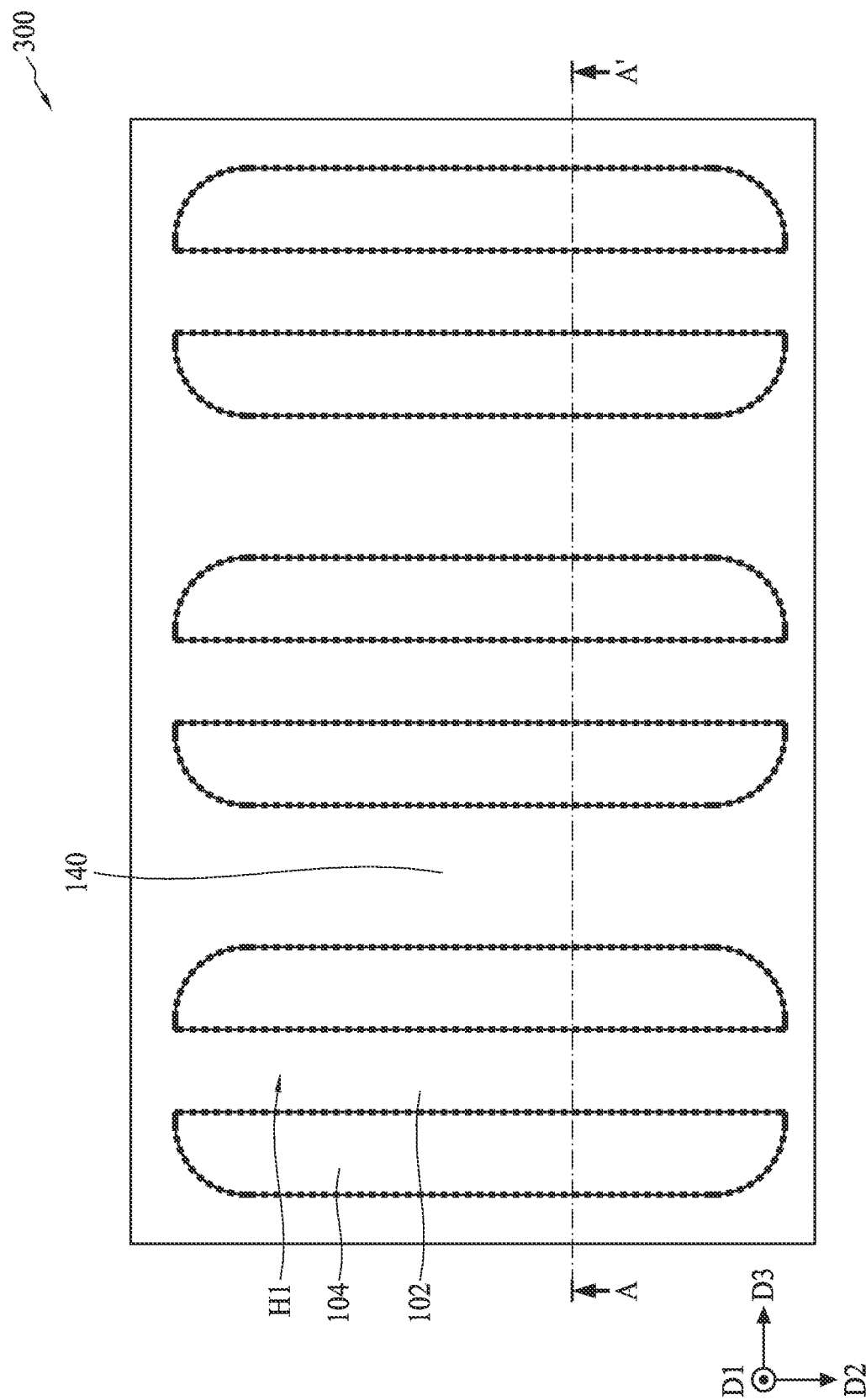

FIG. 1 is a flow diagram showing a method 200 of fabricating a semiconductor structure 300 shown in FIGS. 14A and 14B. FIGS. 2A, 7D, 7E, 8D, 8E, 9E and 9F are schematic perspective of the semiconductor structure views illustrating different stages of the method 200. FIGS. 2B, 3B, 4B, 5B, 5C, 6B, 6C, 7B, 8B, 9C, 9D, 9G, 10B, 11B, 12B, 13B and 14B are schematic cross-sectional views illustrating different stages of sequential operations of the method 200. FIGS. 3A, 4A, 5A, 6A, 7A, 7C, 8A, 8C, 9A, 10A, 11A, 12A, 13A and 14A are schematic top views illustrating different stages of sequential operations of the method 200.

Figure 2A:
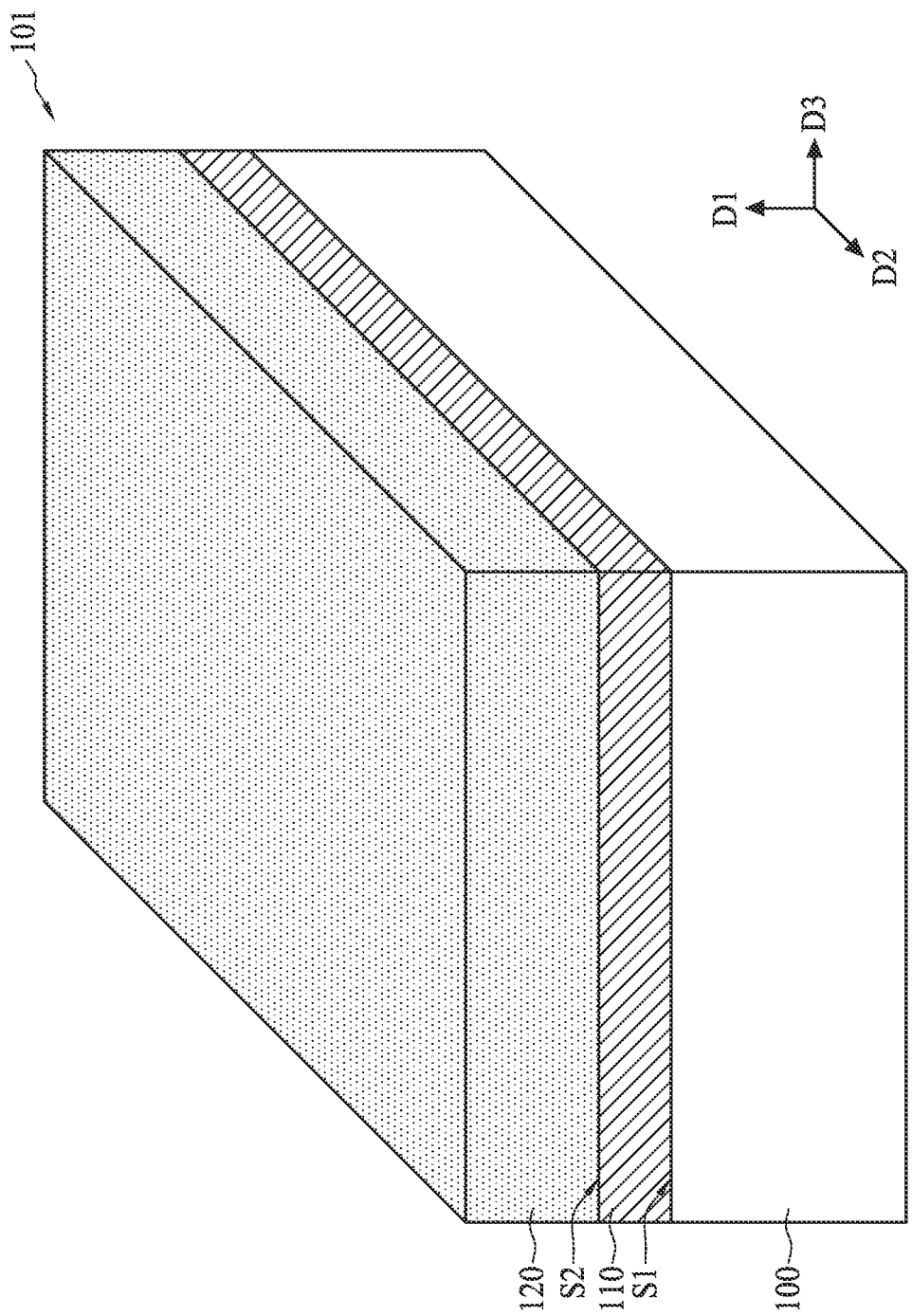
Figure 2B:
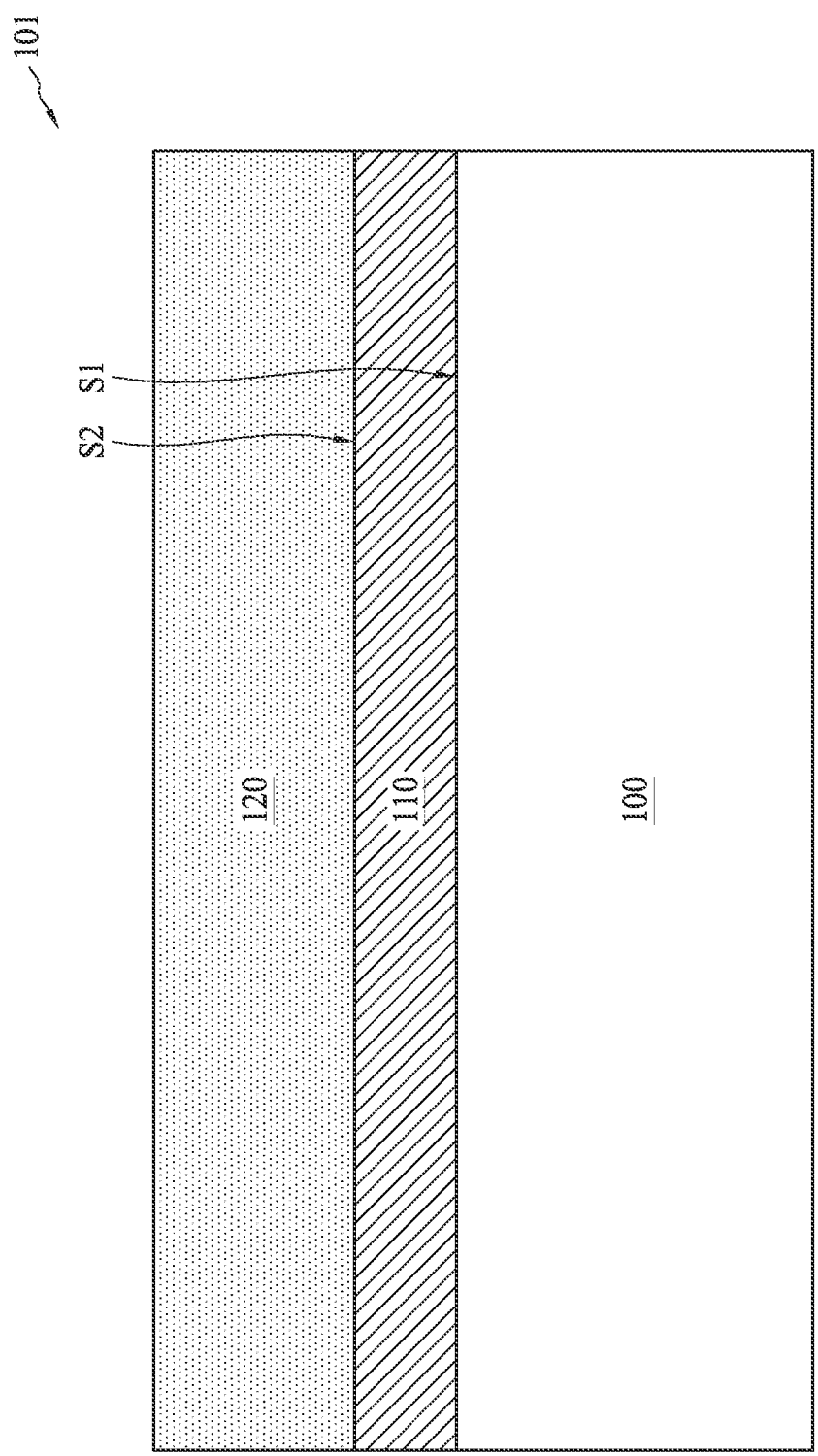

In operation 201, a stacked structure 101 is formed on a substrate 100, as shown in FIGS. 2A and 2B. The stacked structure 101 includes a mask layer 110 over the substrate 100 and a resist layer over the mask layer 110. In some embodiments, the substrate 100 is a semiconductor substrate including doped or undoped silicon (Si), a bulk semiconductor substrate, a crystalline semiconductor substrate or an active region of a semiconductor-on-insulator (SOI) substrate. The substrate 100 may include other semiconductor materials such as germanium (Ge), silicon carbide (SiC), gallium arsenide (GaAs), gallium phosphide (GaP), indium phosphide (InP), indium arsenide (InAs), indium antimonide (InSb) or alloy semiconductors such as SiGe, GaAsP, AlInAs, AlGaAs, GaInAs, GaInP, and GaInAsP or combinations thereof.

In other embodiments, the substrate 100 can be replaced with a dielectric layer which includes, but not limited to, silicon nitride ($Si_3N_4$), silicon oxide ($SiO_2$), fluorinated $SiO_2$ (FSG), boro-phospho-silicate glass (BPSG), other low dielectric constant (<3.9) materials, or combinations thereof. In some embodiments, the dielectric layer is an interlayer dielectric layer or an inter-metal dielectric (IMD) layer. In some embodiments, the substrate 100 includes conductive lines or vias (i.e., metal lines) that provide electrical connections to subsequently formed components.

The mask layer 110 is formed on a top surface S1 of the substrate 100. In some embodiments, the mask layer 110 is formed of a metal or a metallic compound such as titanium (Ti), tantalum (Ta), titanium nitride (TiN) or tantalum nitride (TaN). The mask layer 110 may be formed of metal-doped carbide (e.g., tungsten carbide) or a metalloid (e.g., silicon nitride, boron nitride or silicon carbide). In other embodiments, the mask layer 110 includes silicon oxynitride (SiON), nitride, oxide, low-k or high-k dielectrics. These materials are usually considered to be a "hard mask." The mask layer 110 may include a single-layer structure or a multilayer structure. The mask layer 110 may be formed using a deposition process such as chemical vapor deposition (CVD), physical vapor deposition (PVD), atomic layer deposition (ALD), or the like.

The resist layer 120 is formed on a top surface S2 of the mask layer 110. In some embodiments, the resist layer 120 is formed of a photoresist. The photoresist may be a single layer or include multiple layers. The resist layer 120 may be formed using spin coating or other suitable methods. In some embodiments, the resist layer 120 and the mask layer 110 are stacked over the substrate 100 along a thickness direction D1 substantially orthogonal to the top surface S1 of the substrate 100. Each of the resist layer 120 and the mask layer 110 has a uniform thickness along a length direction D2 and a width direction D3 over the substrate 100. The length direction D2 and the width direction D3 are respectively orthogonal to the thickness direction D1.

Figure 3A:
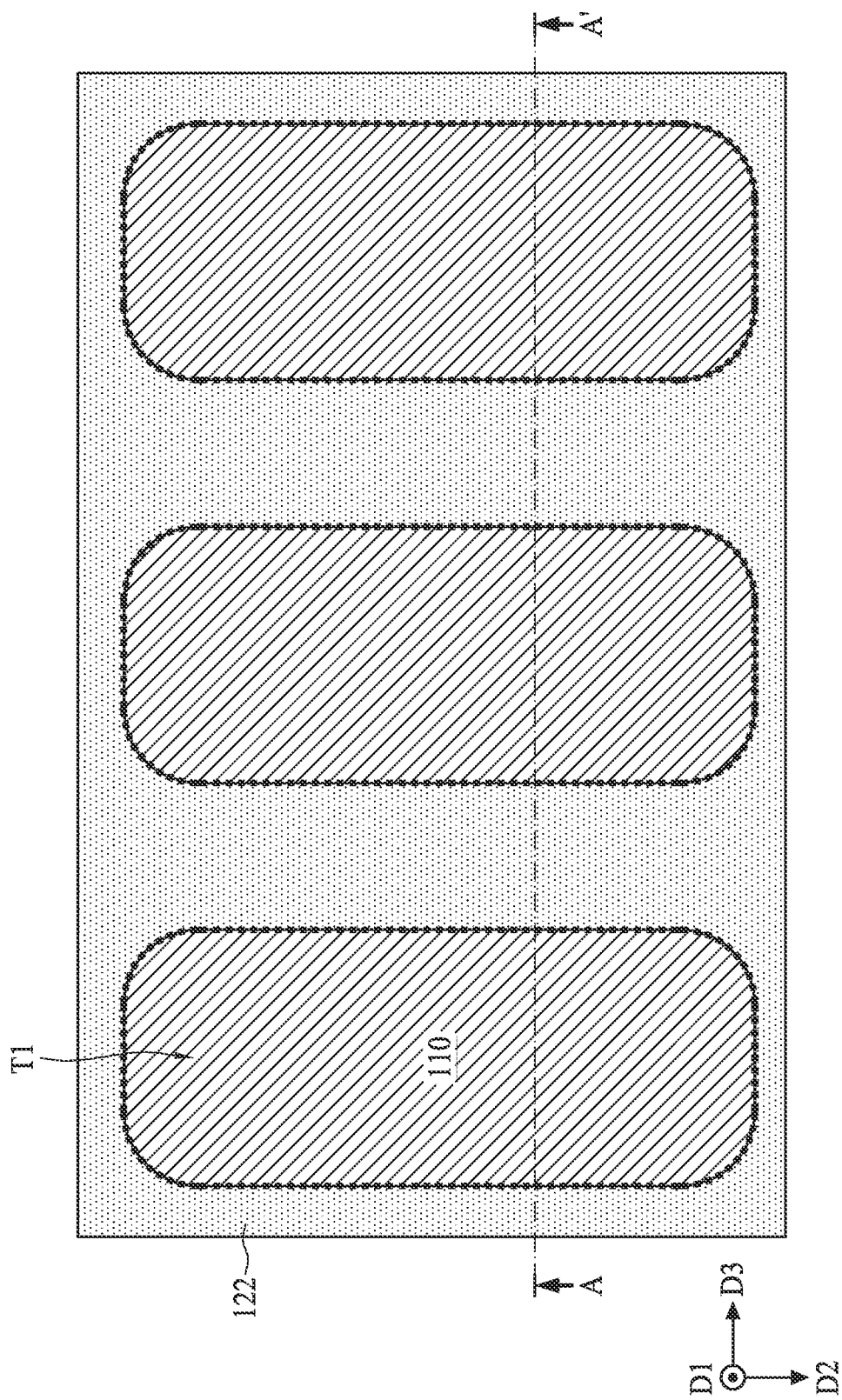
Figure 3B:
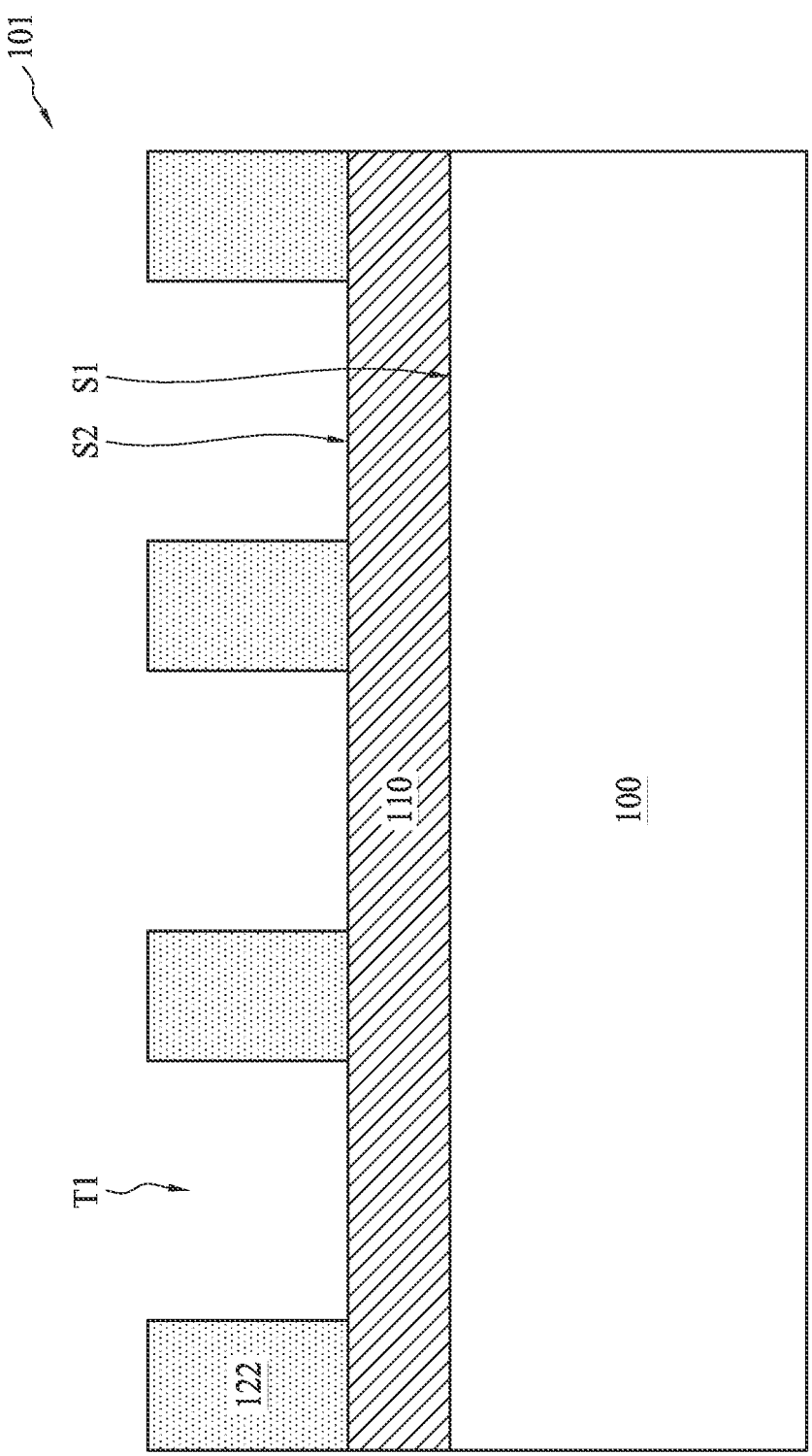

In operation 203, the resist layer 120 of the stacked structure 101 is patterned, as shown in FIGS. 3A and 3B. In some embodiments, the patterning process at least includes a lithography operation, such as exposure and developing steps. After the patterning process, portions of the resist layer 120 are removed and the remaining portions of the resist layer 120 form a mandrel pattern 122 on the mask layer 110. In some embodiments, multiple parallel trenches T1 are formed in the mandrel pattern 122 and portions of a top surface S2 of the mask layer 110 are exposed through the trenches T1. As illustrated in FIG. 3B, in some embodiments, the trench T1 extends along the length direction D2.

Figure 4A:
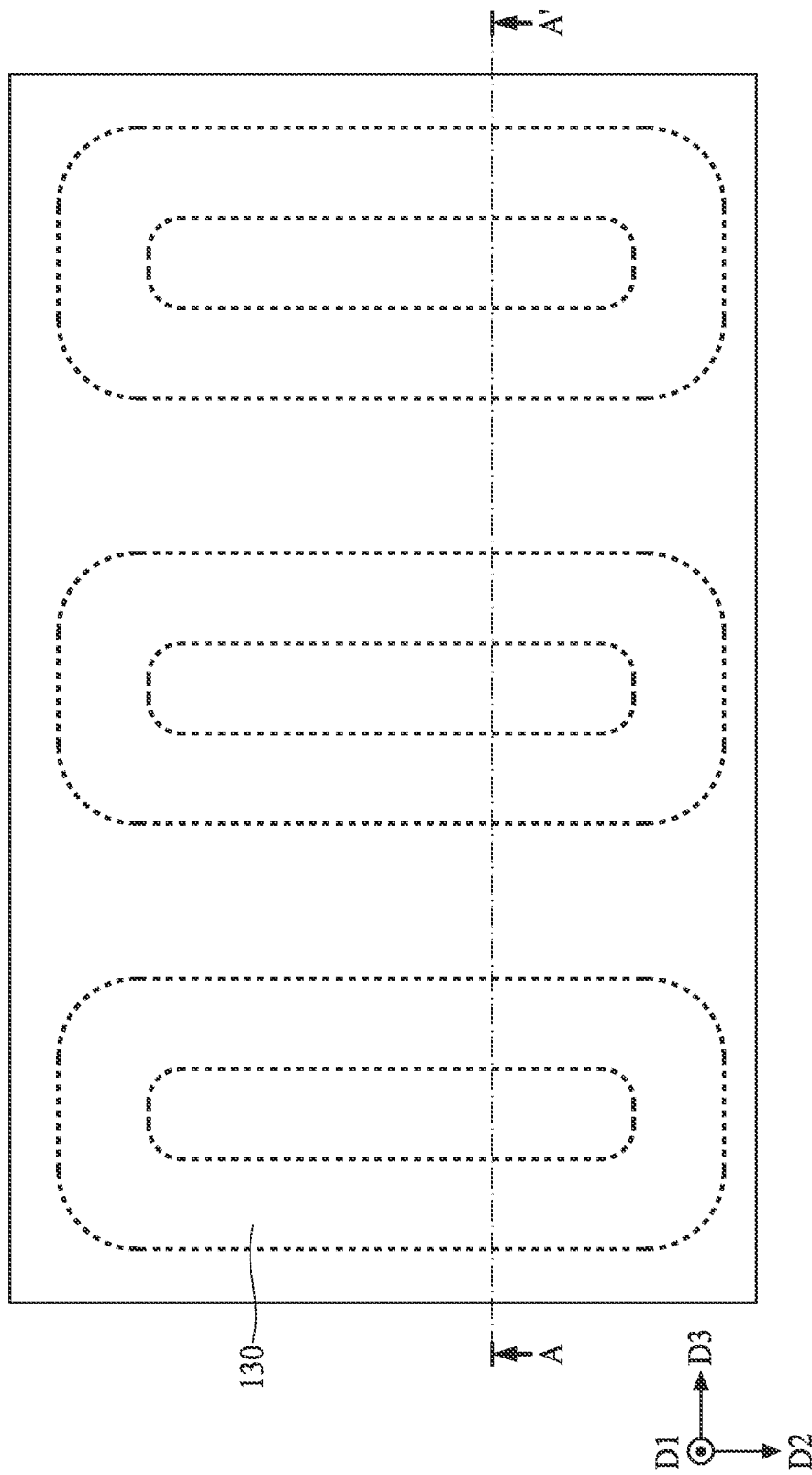
Figure 4B:
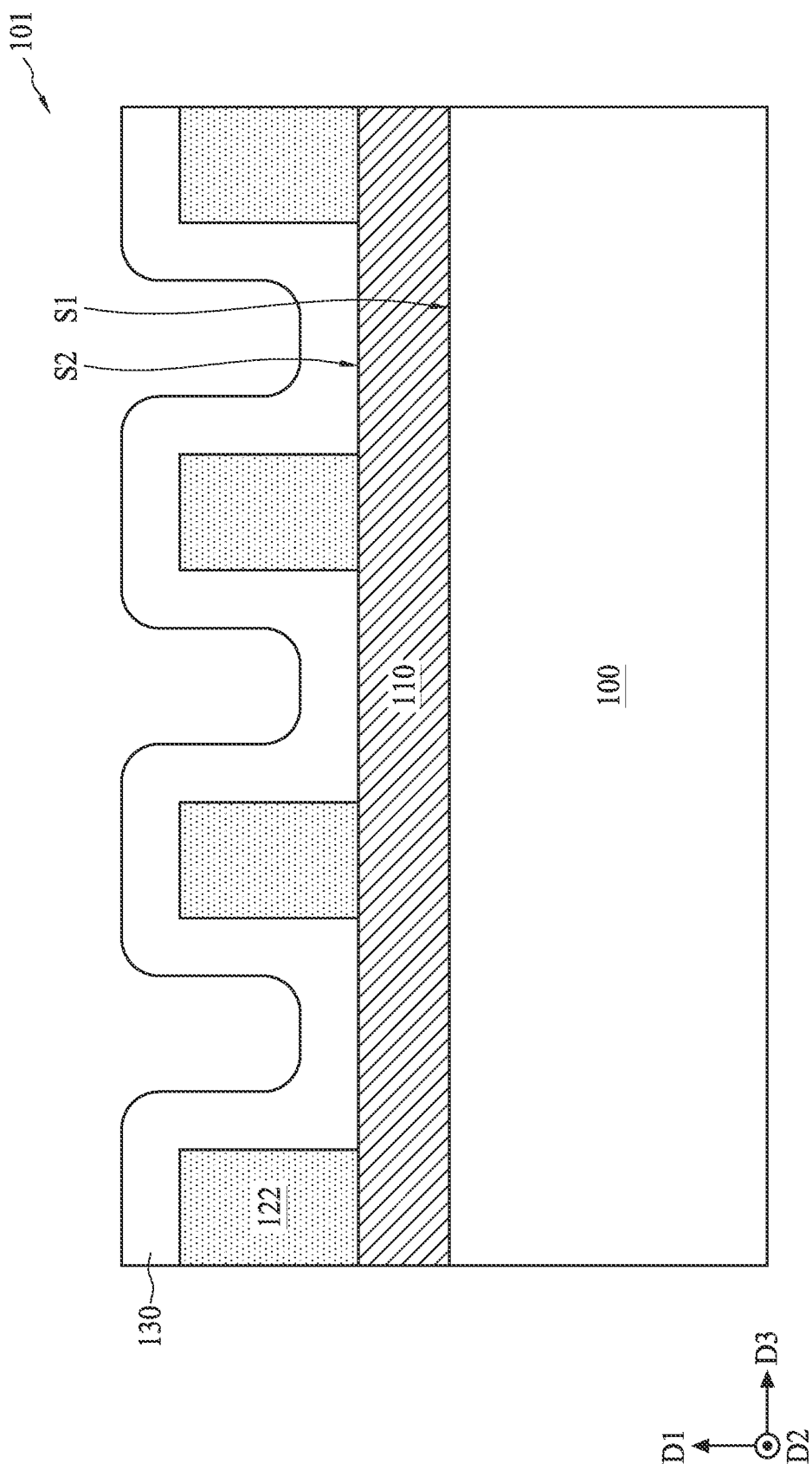

In operation 205, a spacer layer 130 is formed on the stacked structure 101, as shown in FIGS. 4A and 4B. The spacer layer 130 may be deposited over the mandrel pattern 122 and the mask layer 110. In some embodiments, the material of the spacer layer 130 is selected to have a high etching selectivity between the mask layer 110 and mandrel pattern 122. For example, the etching selectivity between the mandrel pattern 122 and the mask layer 110 is between about 2.0 and about 8.0. In some embodiments, the spacer layer 130 is formed of aluminum oxide ($AlO_3$), titanium oxide ($TiO_2$), tantalum oxide ($Ta_2O_5$), silicon oxide ($SiO_2$), hafnium oxide ($HfO_2$) or the like. The spacer layer 130 may be formed using a deposition process such as ALD, CVD, or the like.

As illustrated in FIG. 4B, the spacer layer 130 covers sidewalls of the mandrel pattern 122 and portions of the top surface S2 of the mask layer 110. In some embodiments, the spacer layer 130 is conformally formed such that the spacer layer 130 has substantially equal thicknesses across sidewalk and top surfaces of the mandrel pattern 122.

Figure 5A:
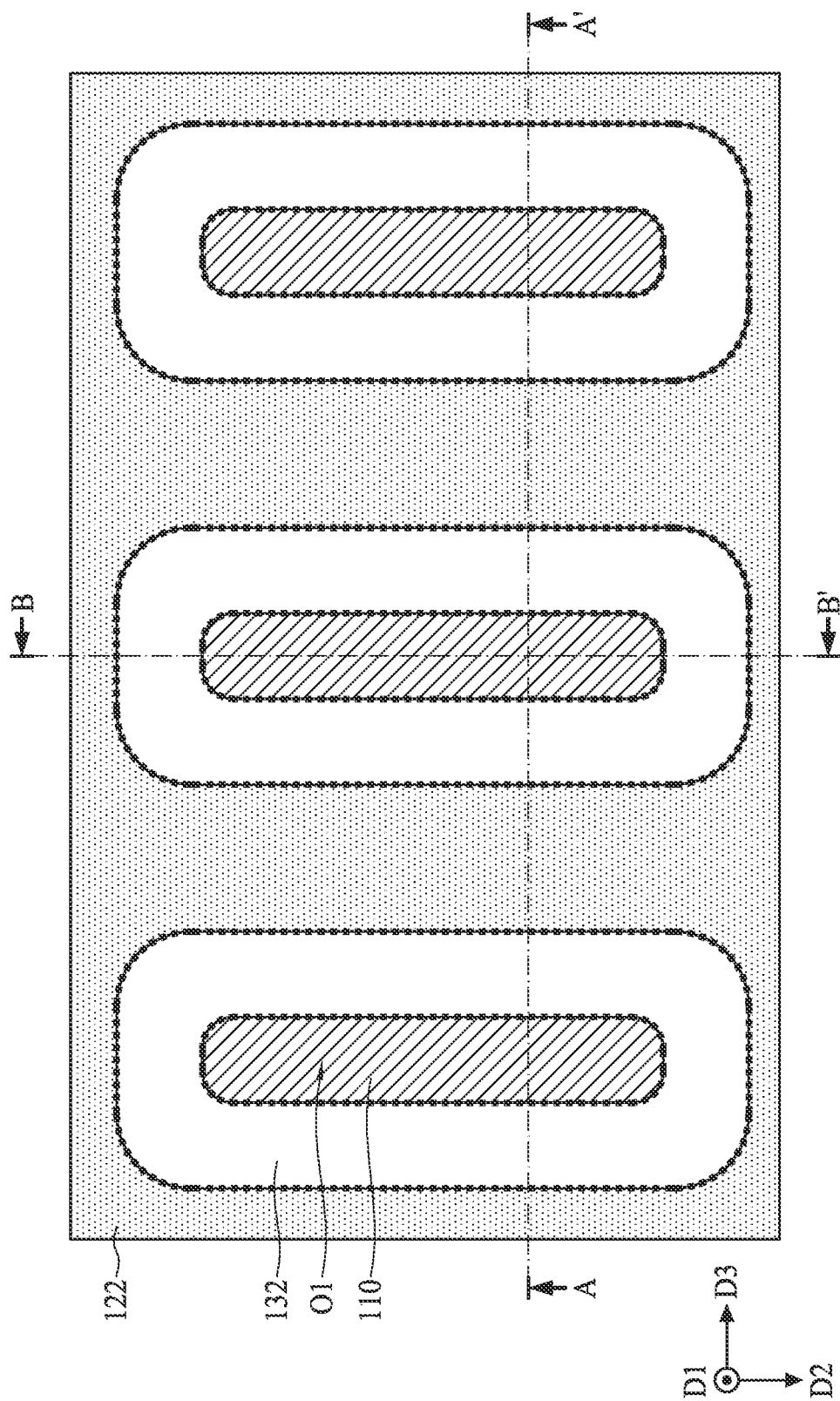
Figure 5B:
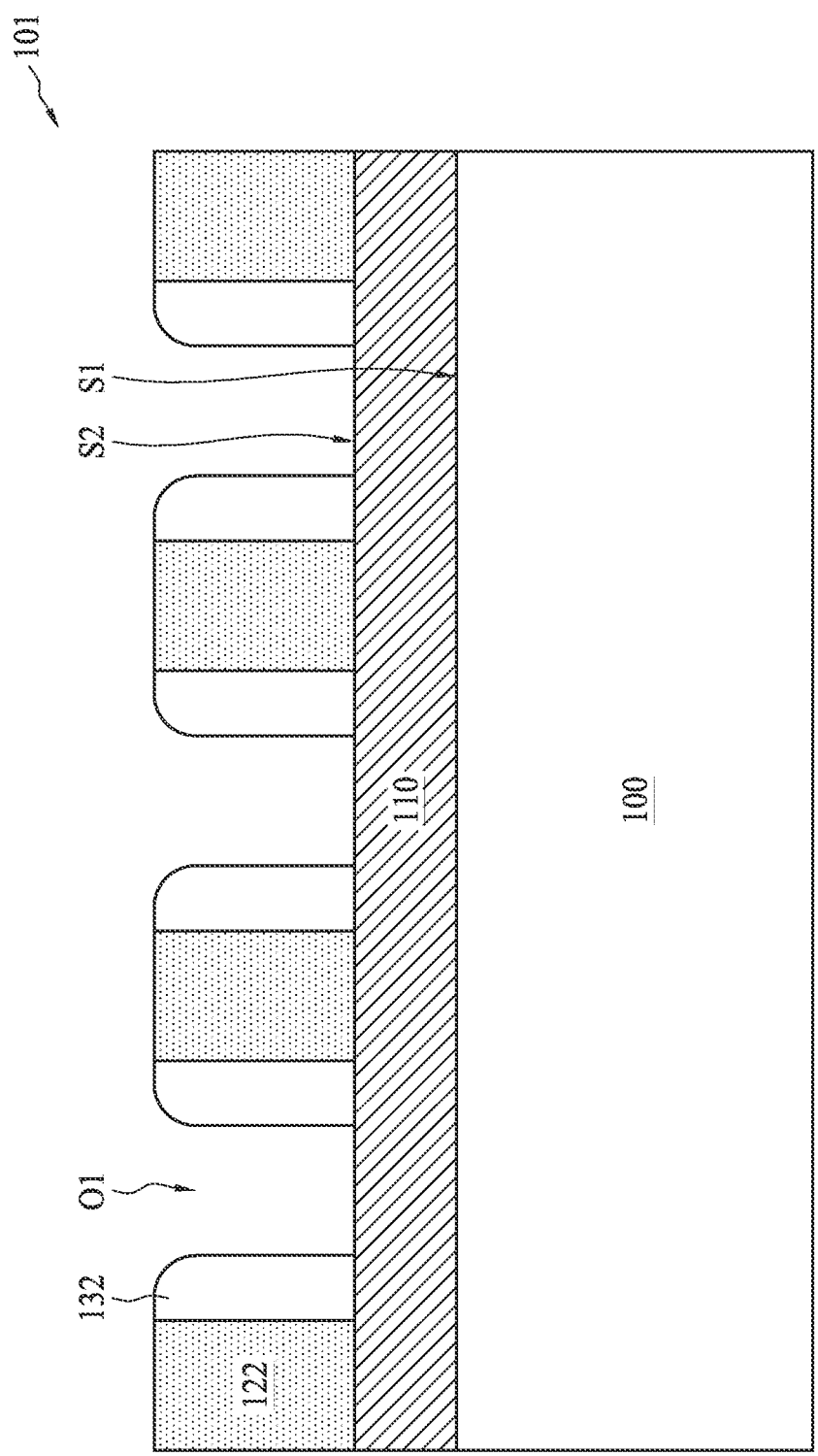
Figure 5C:
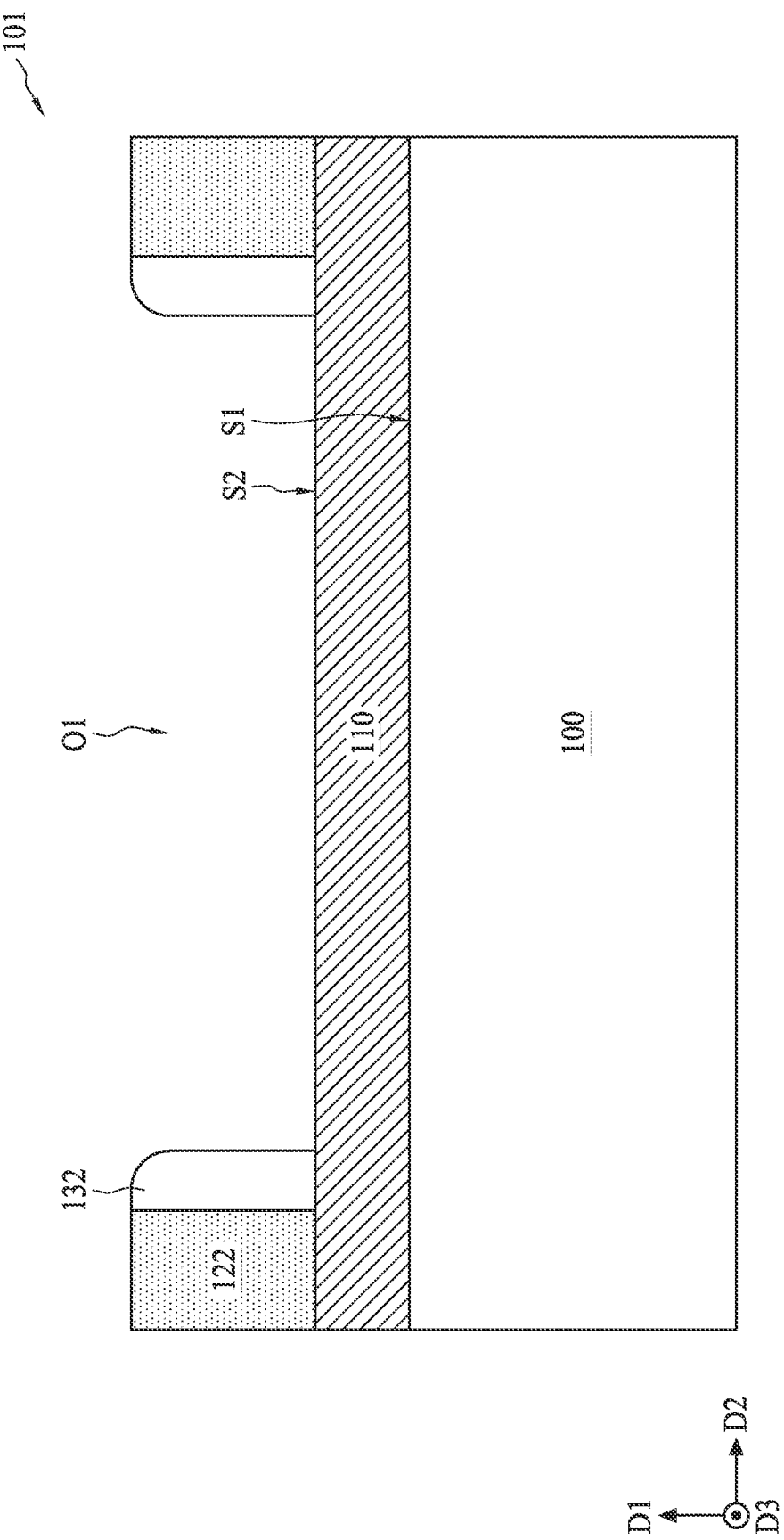

In operation 207, an etching operation is performed on the spacer layer 130, as shown in FIGS. 5A, 5B and 5C. FIGS. 5B and 5C are schematic cross-sectional views respectively taken along line A-A' and line B-B' shown in FIG. 5A. In some embodiments, the etching process for removing portions of the spacer layer 130 is achieved by reactive ion etching (RIE). During the etching operation, the spacer layer 130 over the mandrel pattern 122 is completely removed and the spacer layer 130 over the mask layer 110 is partially removed. In such embodiments, the remaining portion of the spacer layer 130 forms multiple spacer patterns 132 left on sidewalk of the mandrel pattern 122. The spacer pattern 132 may have a closed contour, e.g., the spacer pattern 132 includes an opening O1 from a top-view perspective.

As illustrated in FIGS. 5B and 5C, in some embodiments, the opening O1 extends along the length direction D2. Multiple openings O1 may be formed over the mask layer 110 and parallel to each other. Portions of the mask layer 110 are exposed through the openings O1.

Figure 6A:
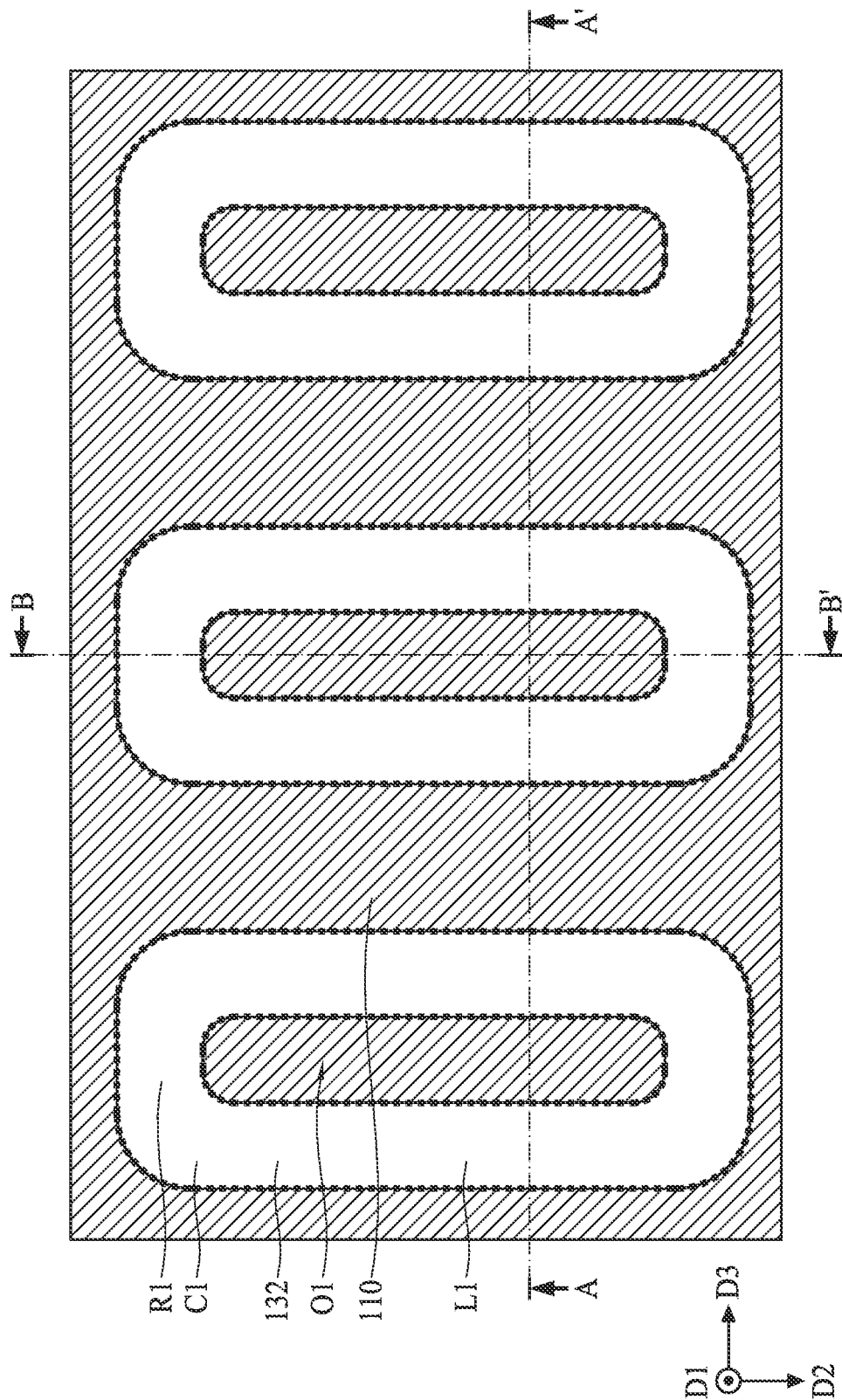
Figure 6B:
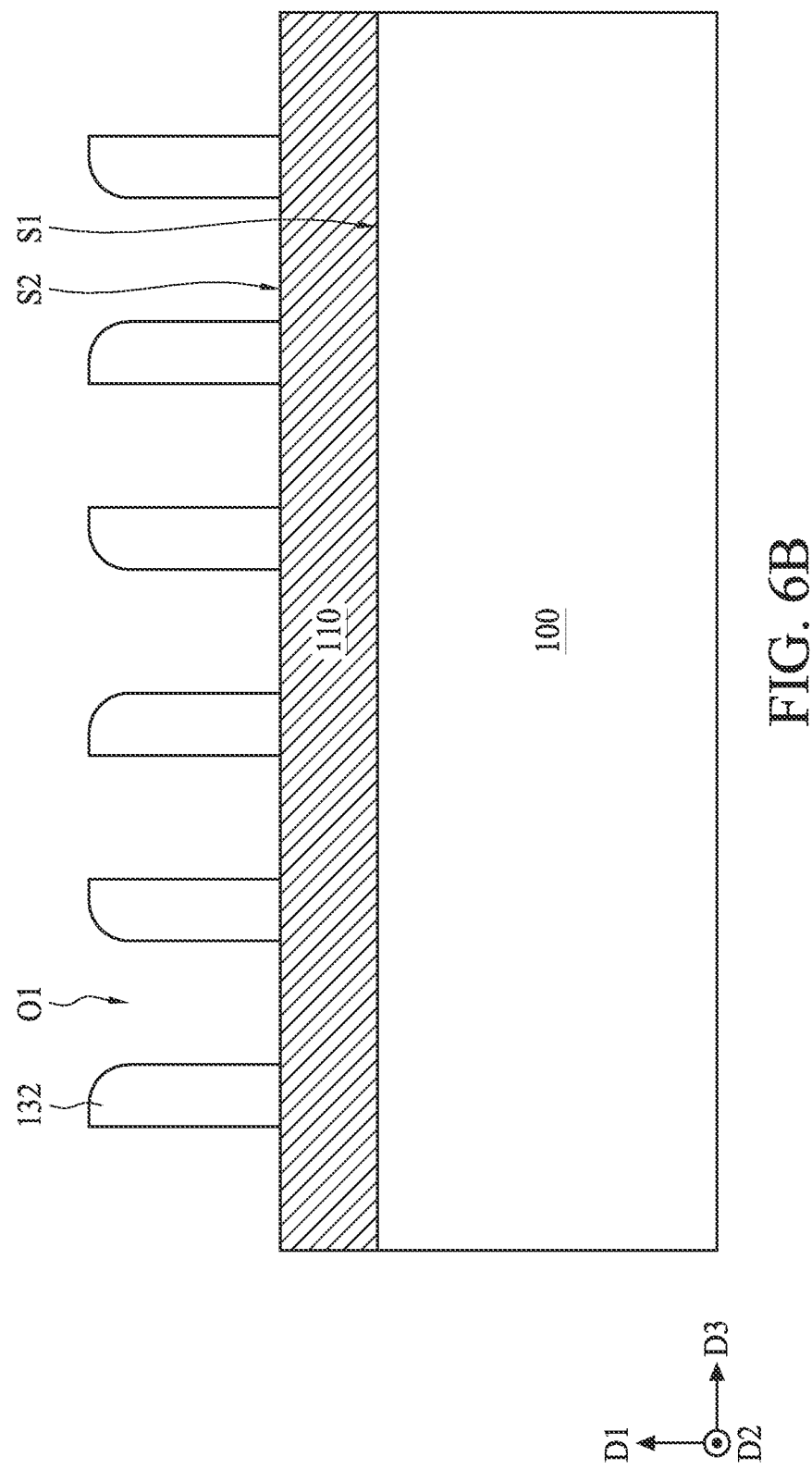
Figure 6C:
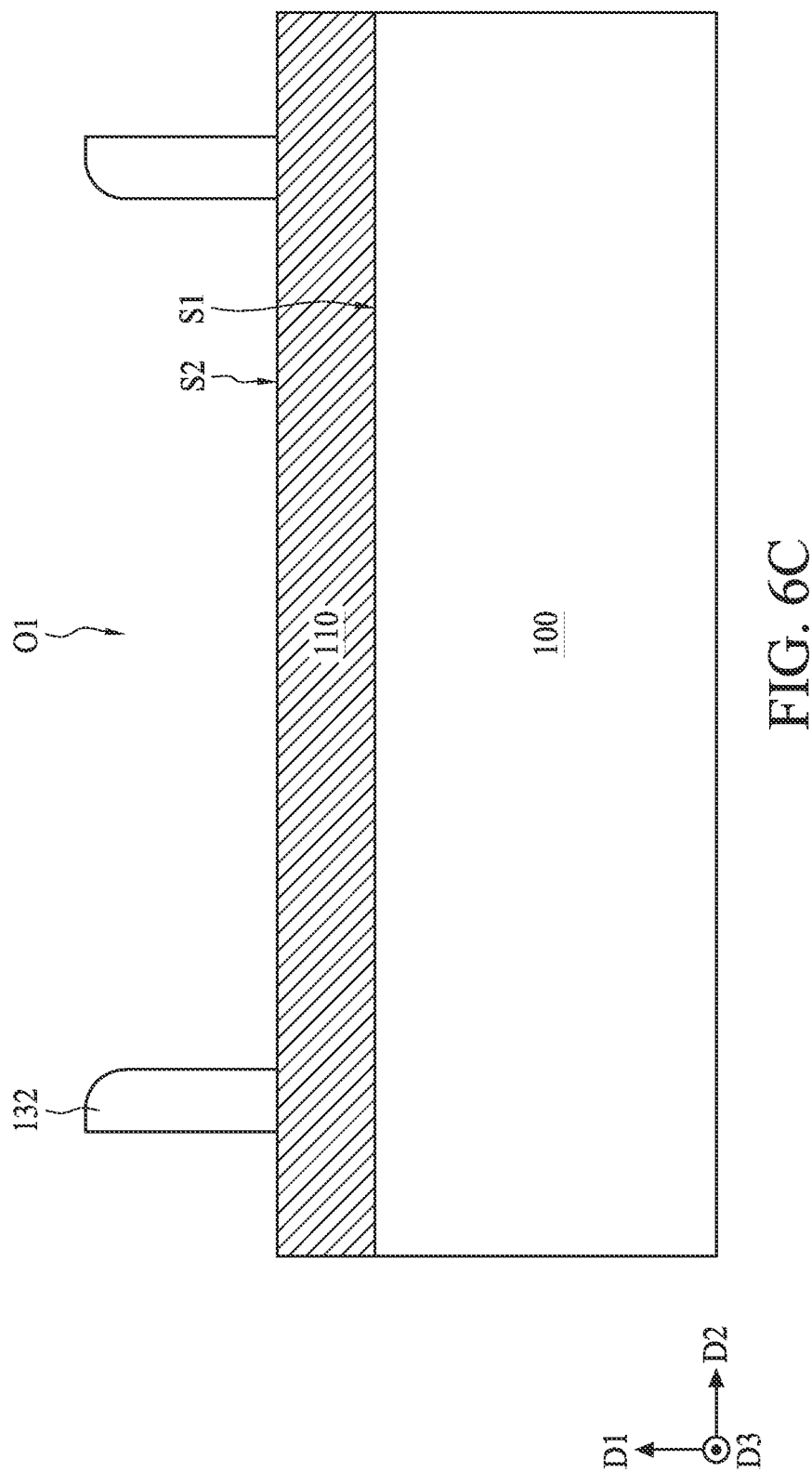

In operation 209, the mandrel pattern 122 is removed, as shown in FIGS. 6A, 6B and 6C. FIGS. 6B and 6C are schematic cross-sectional views respectively taken along line A-A' and line B-B' shown in FIG. 6A. An etching operation may be used to remove the mandrel pattern 122 and leave the spacer patterns 132 on the mask layer 110. In some embodiments, the mandrel pattern 122 is differentiated from the spacer patterns 132 and the mask layer 110 in terms of an etching selectivity of the same etchant. The etching process may be selective to the mandrel pattern 122 and do not remove (or remove insignificantly) the spacer patterns 132 and the mask layer 110. Therefore, the mandrel pattern 122 can be completely removed while the spacer patterns 132 and the mask layer 110 are kept substantially intact after the etching process. In some embodiments, the underlying mask layer 110 acts as an etch stop layer during the removal of the mandrel pattern 122. After the mandrel pattern 122 is removed, each of the spacer patterns 132 is formed on the mask layer 110 along with the respective opening O1. The opening O1 may be defined by the spacer pattern 132 as a closed contour. In some embodiments, at least one of the spacer patterns 132 has a ring shape when viewed from above. The ring-shaped spacer pattern 132 may have rounded corners around their top portions. In some embodiments, each of the spacer patterns 132 has a pair of length portions L1 extending along the length direction D2, a pair of width portions R1 extending along the width direction D3, and corner portions C1 connecting the length portions L1 and the width portions R1.

In operation 211, at least one directional etching operation is performed on the spacer patterns 132, as shown in FIGS. 7A to 7E and 8A to 8E. In some embodiments, the directional etching operation includes a slanted plasma etching. The tilt angle of the plasma may be controlled based on a desired etching profile so as to adjust the etching direction.

Figure 7A:
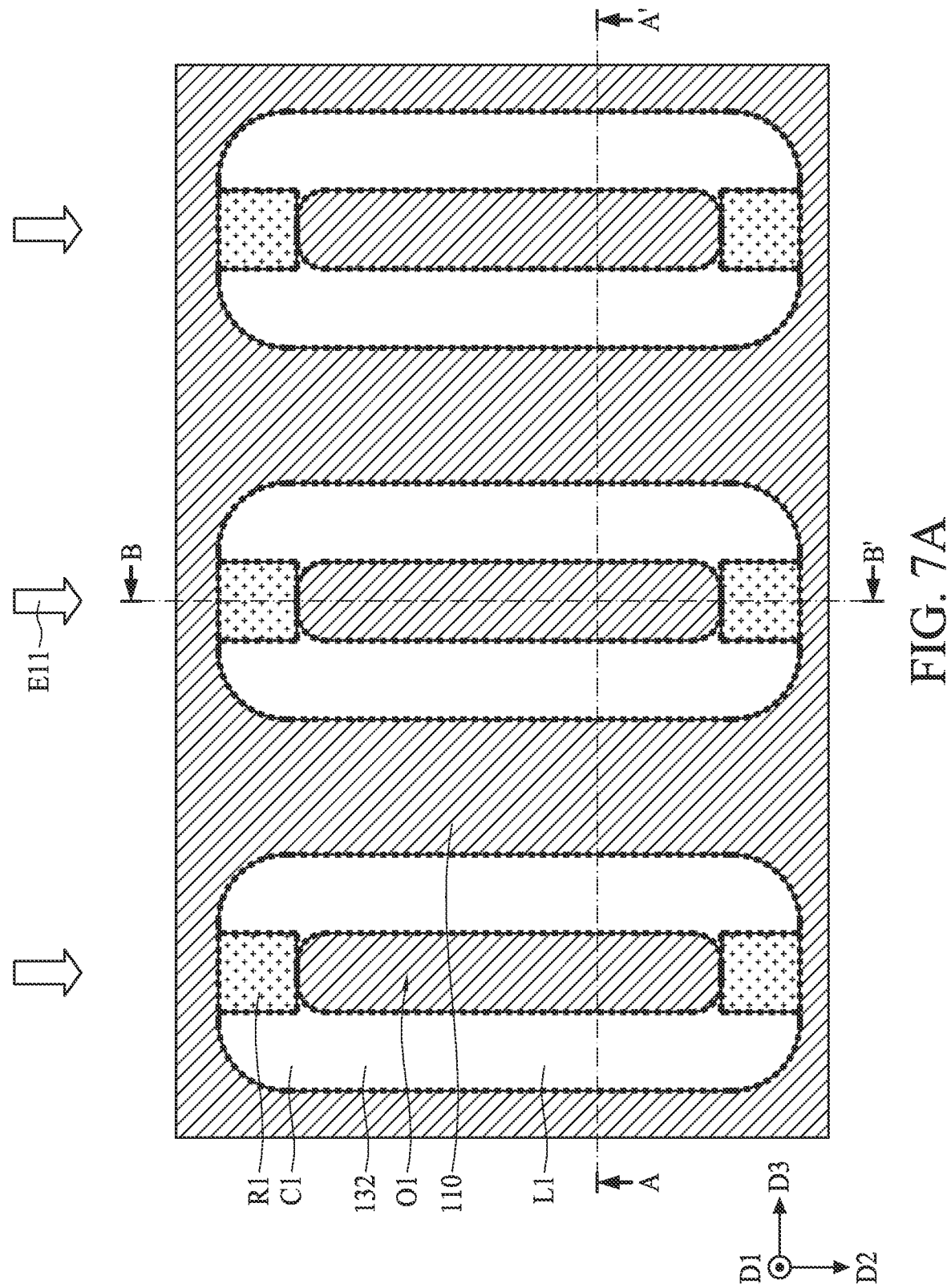

Referring to FIG. 7A, in some embodiments, a directional etching operation E11 is applied to the spacer patterns 132 along the length direction D2 from a top-view perspective. The directional etching operation E11 may be selective to the spacer patterns 132 and do not remove (or substantially do not remove) the mask layer 110. As shown in FIG. 7A, the width portions R1 and the corner portion C1 of the spacer patterns 132 are orthogonal to an incident direction of the directional etching operation E11, as shown in FIG. 7A, and therefore the width portions R1 and the corner portions C1 of the spacer patterns 132 may encounter more plasma than the length portions L1. In such embodiments, the width portions R1 and the corner portions C1 receive more ion treatments or plasma bombardment during the directional etching operation E11. In some embodiments, the directional etching operation E11 is used to trim the width portions R1 while substantially preserving the length portions L1 from trimming.

Figure 7B:
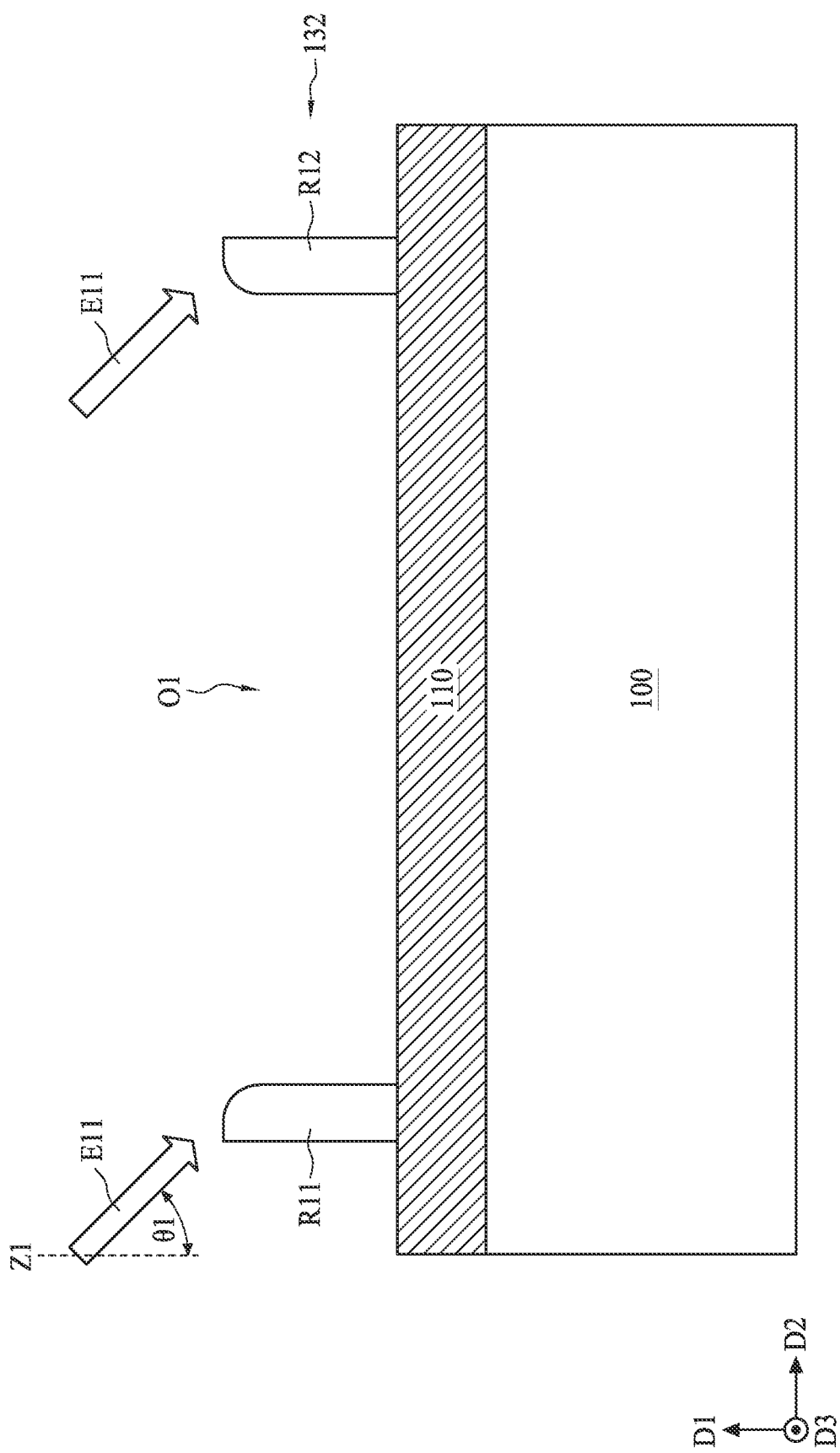

FIG. 7B is a schematic cross-sectional view taken along line B-B' shown in FIG. 7A. In the directional etching operation E11, a plasma with a first tilt angle $\theta 1$ is used to bombard the width portions R1 along one side of the length direction D2 (i.e., the left side of the length direction D2 in the cross-sectional view). The first tilt angle $\theta 1$ refers to an angle between the incident direction of the directional etching operation E11 and a normal axis Z1 that extends along the thickness direction D1.

Figure 7D:
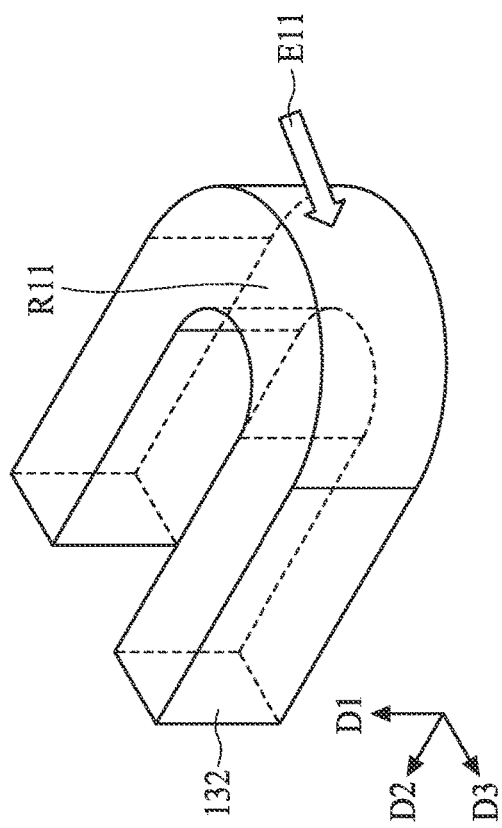
Figure 7E:
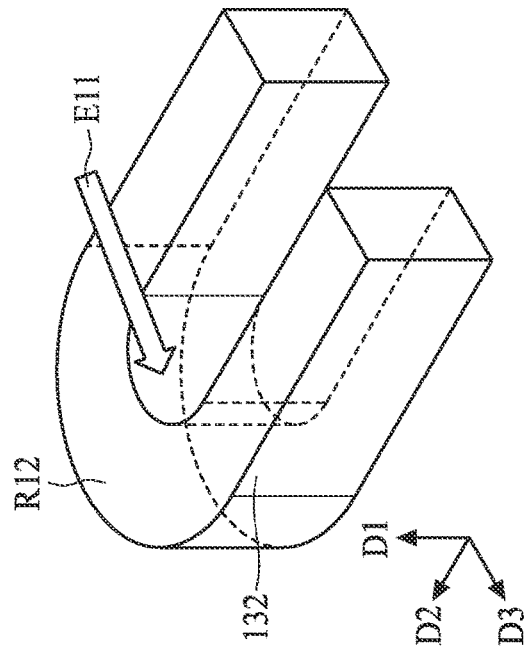
Figure 7C:
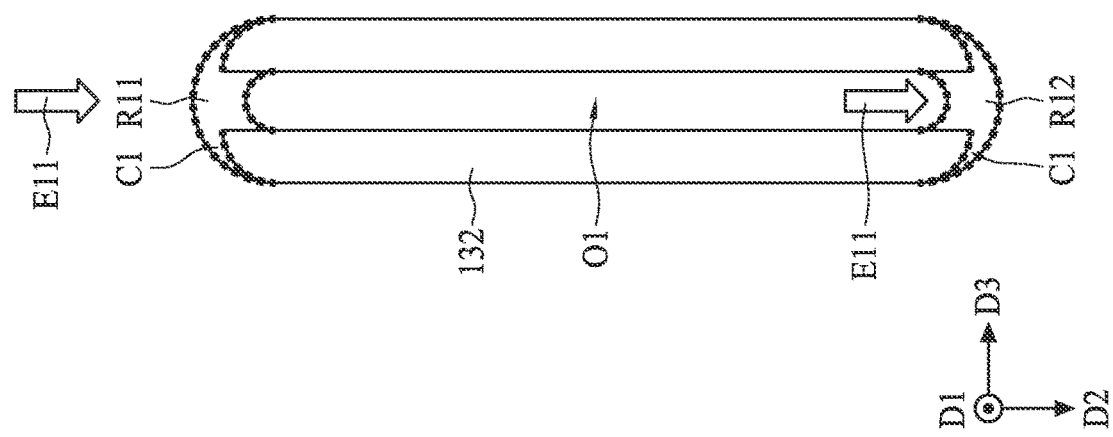

FIG. 7C illustrates one of the spacer patterns 132 shown in FIG. 7A being etched during the directional etching operation E11 from a top-view perspective. The width portion R1 may include a first width portion R11 and a second width portion R12 opposite to each other. In some embodiments, the width portion R11 is bombarded from an exterior side of the spacer pattern 132, and the width portion R12 is bombarded from an interior side of the spacer pattern 132. In such embodiments, the two opposing width portions R11 and R12 are simultaneously bombarded by the plasma in the directional etching operation E11. As the plasma continuously bombards the first and second width portions R11, R12, the opening O1 is gradually elongated along the length direction D2. After the two opposing width portions R11 and R12 are etched through, the closed contour of the spacer pattern 132 is broken or cut open. Corner portions C1 of the spacer pattern 132 may be partially trimmed during the removal of the width portion R1.

FIGS. 7D and 7E are respectively schematic perspective views of the first and second width portions R11 and R12 in FIG. 7C. In some embodiments, the first width portion R11 is directionally etched from the exterior side of the spacer pattern 132, as shown in FIG. 7D. In some embodiments, the second width portion R12 is directionally etched from the interior side of the spacer pattern 132, as shown in FIG. 7E. In such embodiments, the exterior and interior sides of the spacer pattern 132 are simultaneously etched.

Figure 8A:
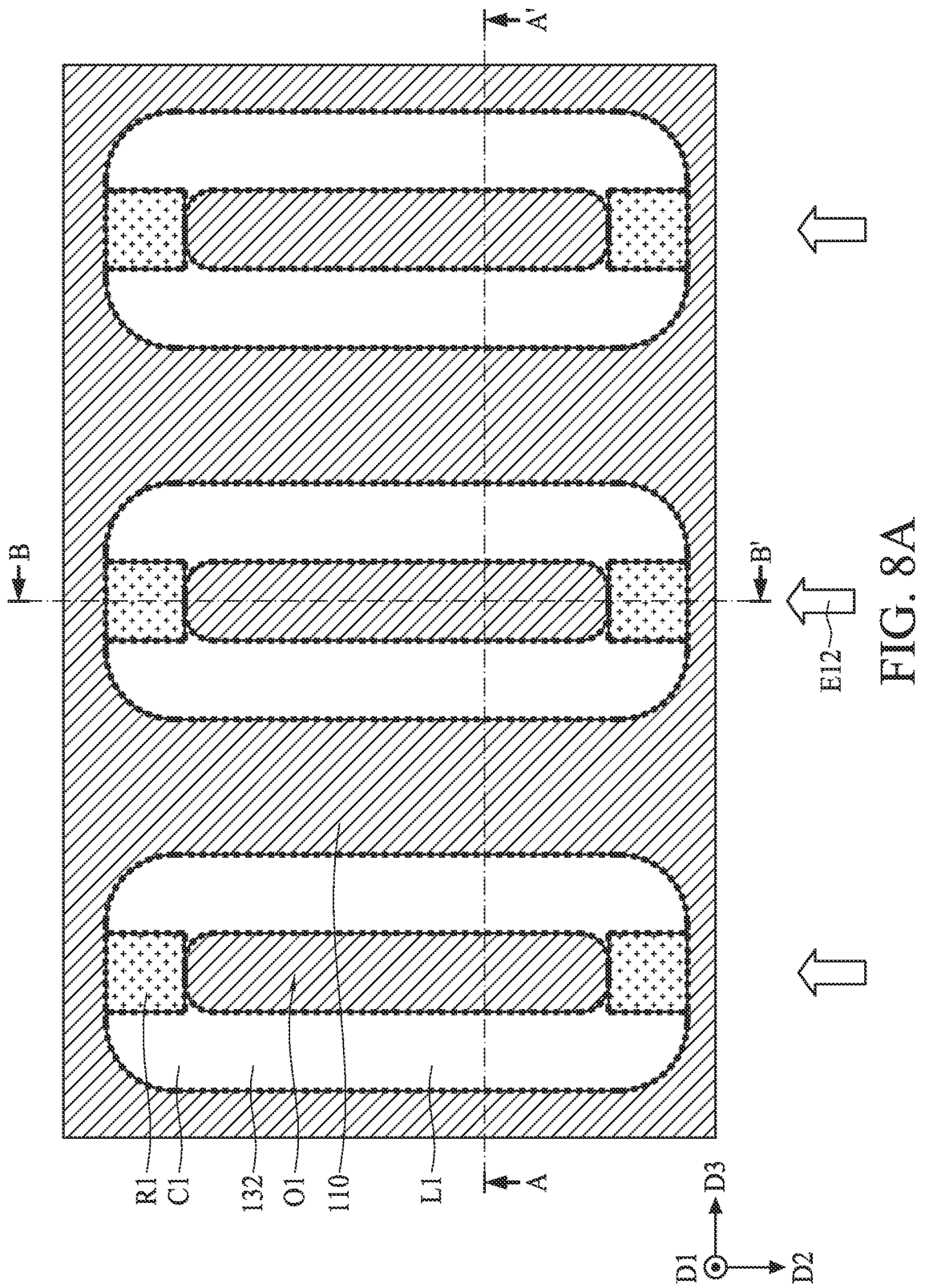

Referring to FIG. 8A, in some embodiments, a directional etching operation E12 is applied to the spacer patterns 132 along the length direction D2 from a top-view perspective. In some embodiments, the directional etching operation E12 is applied along an opposite direction to the directional etching operation E11 from a top-view perspective. The directional etching operation E12 may be similar to the directional etching operation E11 in many aspects except for the incident direction.

Figure 8B:
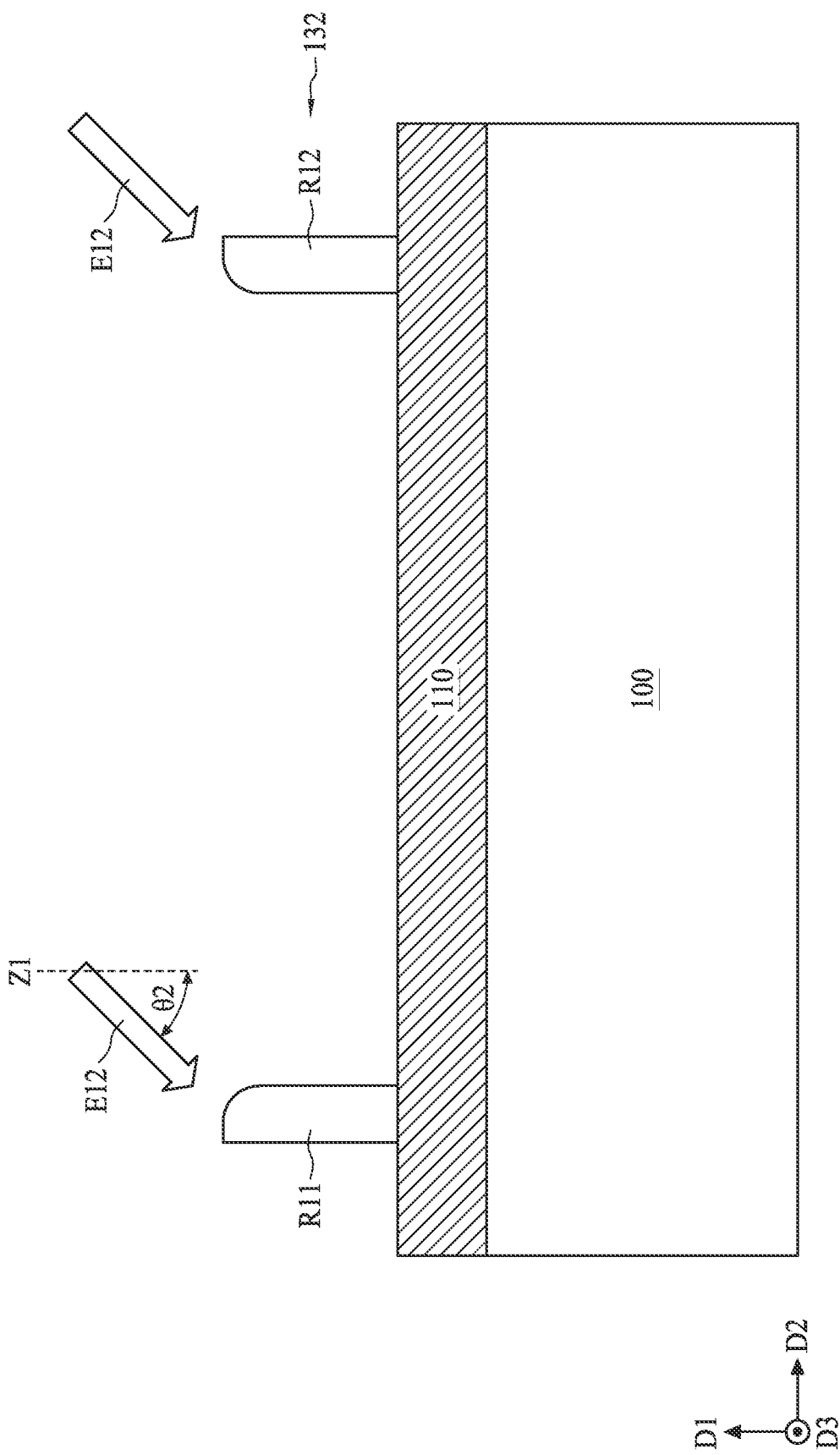

FIG. 8B is a schematic cross-sectional view taken along line B-B' shown in FIG. 8A. In the directional etching operation E12, a plasma with a second tilt angle $\theta 2$ is used to bombard the width portions R1 along the other side of the length direction D2 (i.e., the right side of the length direction D2 in the cross-sectional view). The definition of the second tilt angle $\theta 2$ may be the same as the first tilt angle $\theta 1$ but symmetrical to the first tilt angle $\theta 1$ with respect to the normal axis Z1. In some embodiments, the second tilt angle $\theta 2$ is substantially equal to the first tilt angle $\theta 1$ in value. In other embodiments, the first tilt angle $\theta 1$ and the second tilt angle $\theta 2$ are different.

Figure 8D:
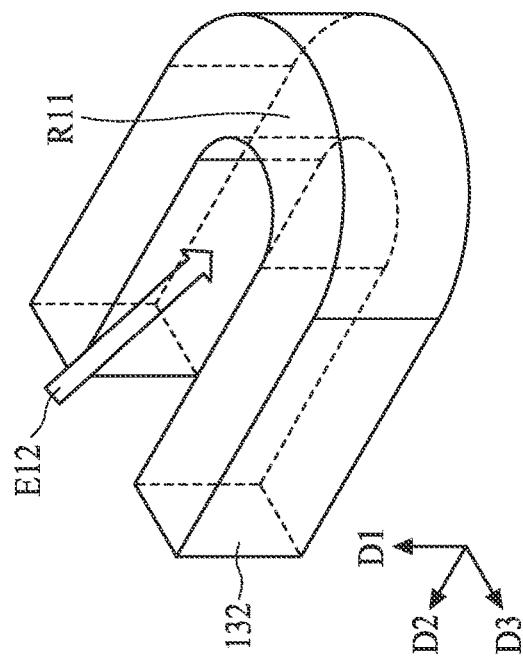
Figure 8E:
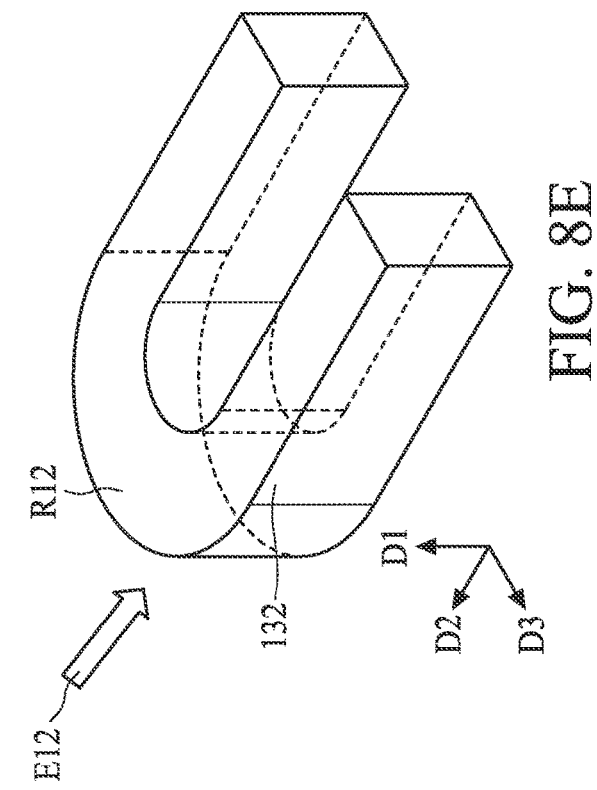
Figure 8C:
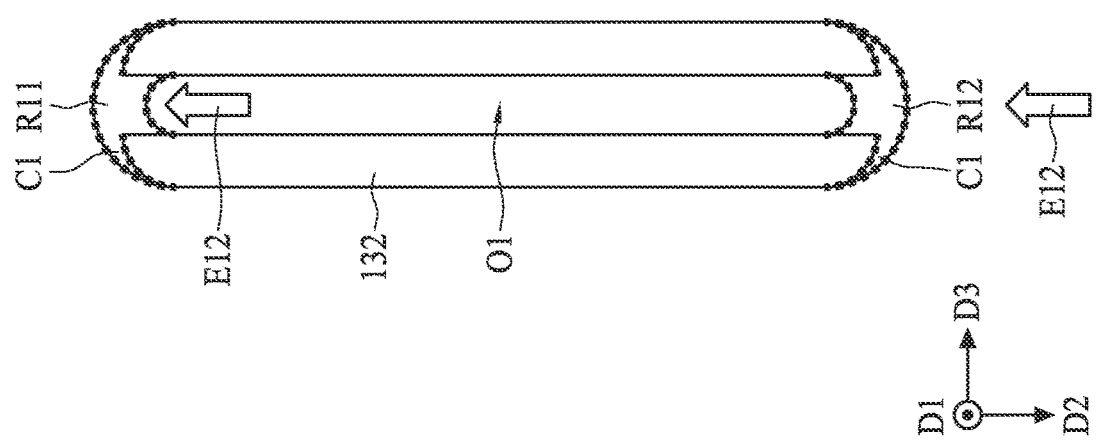

FIG. 8C illustrates one of the spacer patterns 132 shown in FIG. 8A being etched during the directional etching operation E12 from a top-view perspective. In some embodiments, the width portion R11 is bombarded from the interior side of the spacer pattern 132, and the width portion R12 is bombarded from the exterior side of the spacer pattern 132. In such embodiments, the two opposing width portions R11 and R12 are simultaneously bombarded by the plasma in the directional etching operation E12.

FIGS. 8D and 8E are respectively schematic perspective views of the first and second width portions R11 and R12 in FIG. 8C. In some embodiments, the first width portion R11 is directionally etched from the interior side of the spacer pattern 132, as shown in FIG. 8D. In some embodiments, the second width portion R12 is directionally etched from the exterior side of the spacer pattern 132, as shown in FIG. 8E. In such embodiments, the exterior and interior sides of the spacer pattern 132 are simultaneously etched.

In some embodiments, the directional etching operation E11 and the directional etching operation E12 together etch through the first and second width portions R11, R12 and break the closed contour of the spacer pattern 132. In such embodiments, the two directional etching operations E11 and E12 are alternatively performed with more than one cycle, such as 2 to 4 cycles, until the width portions R1 of the spacer patterns 132 are completely removed. In other embodiments, the directional etching operation E11 alone etches through the first and second width portions R11, R12 and breaks the closed contour of the spacer pattern 132.

FIG. 9A is a schematic top view illustrating multiple spacer features 134 generated from the spacer patterns 132 after operation 211. After applying the directional etching operation E11 and/or the directional etching operation E12, the spacer features 134 are formed on the mask layer 110. In some embodiments, the spacer features 134 extend along the length direction D2. In some embodiments, the spacer features 134 are arranged in parallel along the width direction D3.

Figure 9B:
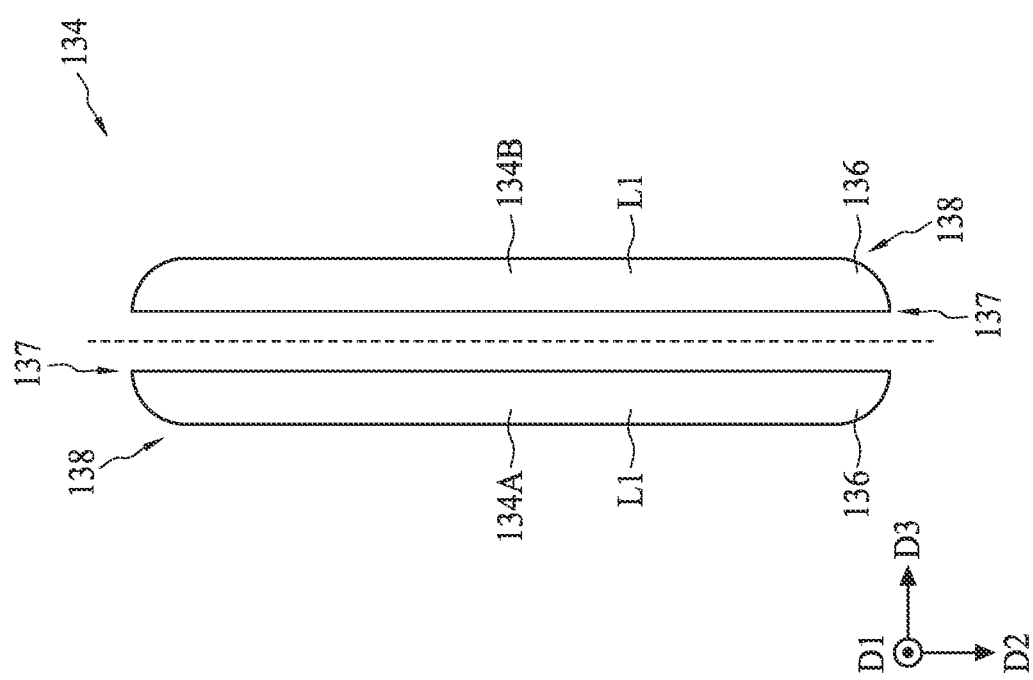

FIG. 9B is a schematic top view continued from FIG. 7C or 8C and shows a pair of spacer features 134. Since the directional etching operations E11 and E12 are symmetrical to each other, two adjacent spacer features 134 may be formed in a pair when a single spacer pattern 132 is etched to remove its opposite width portions R11 and R12. In some embodiments, each of the spacer patterns 132 is cut into two spacer features 134A and 134B. The two spacer features 134A and 134B may be symmetrical with respect to a central line M1 extending in the length direction D2 between the two spacer features 134A and 134B from a top-view perspective. That is, the two spacer features 134A and 134B may mirror images to each other. The spacer features 134 may have rounded or sharp corners from a top-view perspective. In some embodiments, each of the spacer features 134A and 134B has two trimmed ends 136, The trimmed end 136 may have a sharp corner 137 connected to the inner sides of the length portion L1 and a round corner 138 connected to the outer sides of the length portion L1.

Figure 9C:
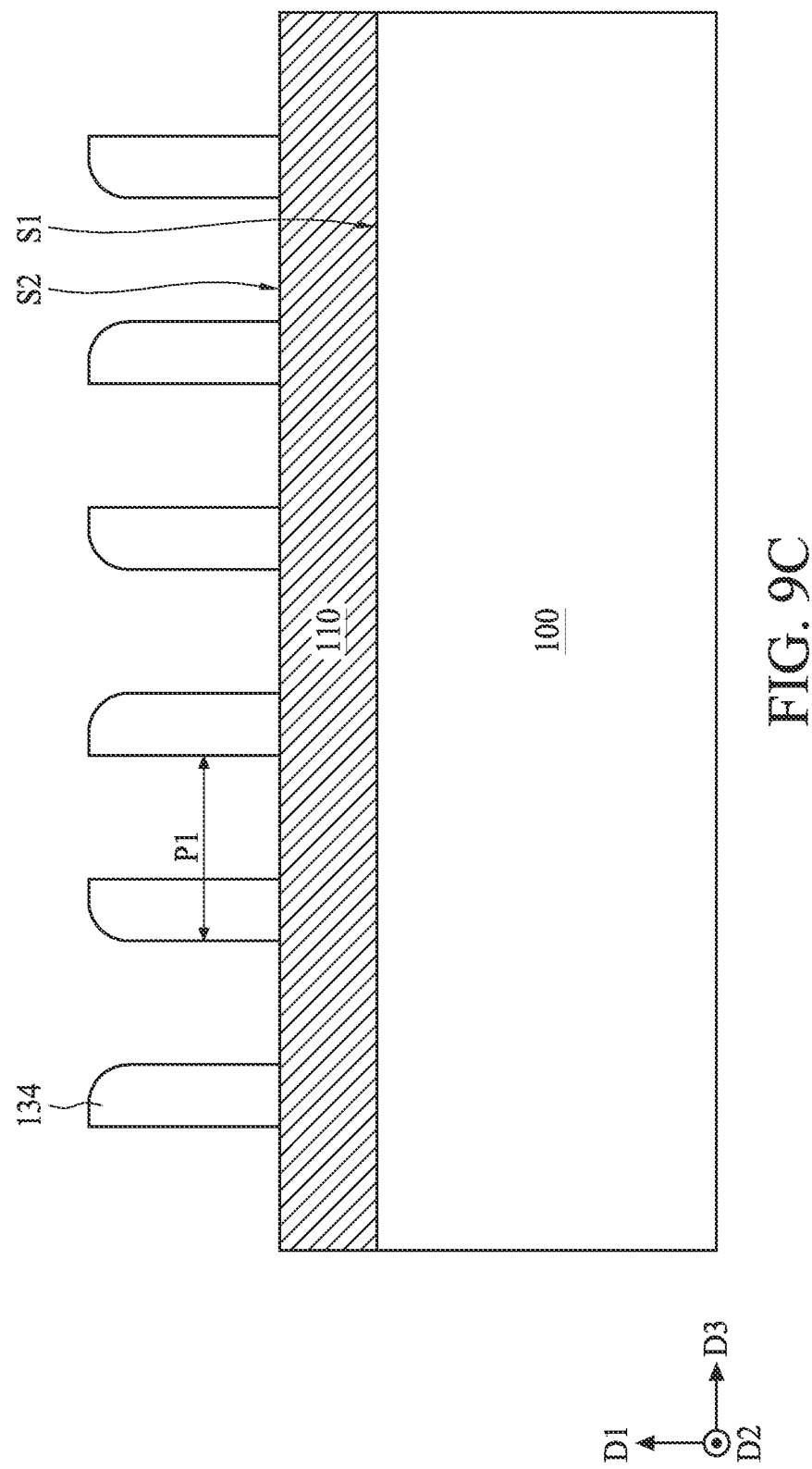

FIG. 9C is a schematic cross-sectional view taken along line A-A' shown in FIG. 9A. In some embodiments, any two adjacent spacer features 134 have a fixed pitch P1, which is a feature of an SADP process. The pitch P1 is substantially equals to a total width of one opening O1 (as shown in FIG. 6B) and one spacer feature 134.

Figure 9D:
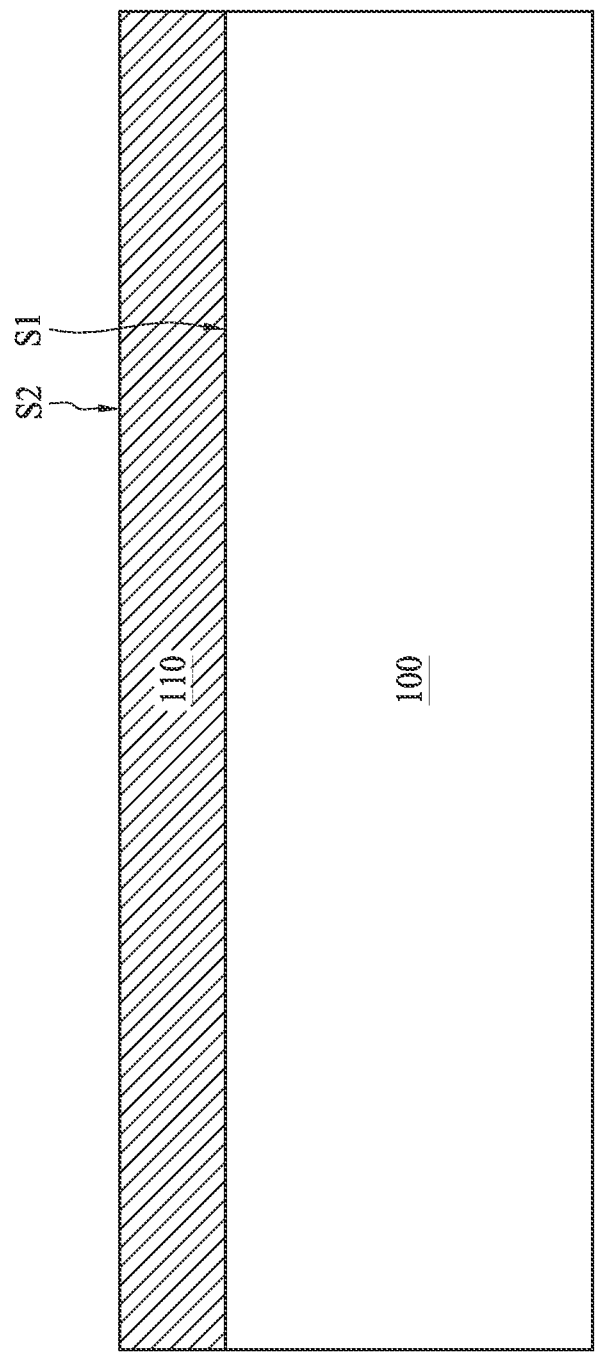

FIG. 9D is a schematic cross-sectional view taken along line B-B' shown in FIG. 9A. Since the spacer features 134 are formed along the length direction D2, there may be no spacer feature 134 shown in the cross-sectional view along line B-B'.

FIGS. 9E and 9F illustrate schematic perspective views of spacer features 134. Each of the spacer features 134 may have an inner sidewall W1 and an outer sidewall W2. The inner sidewall W1 may be connected to the outer sidewall W2 via a boundary line B1. In some embodiments, the inner sidewall W1 is substantially a flat surface. The inner sidewall W1 may face the width direction D3, and the pair of inner sidewalls W1 may face each other. In some embodiments, the outer sidewall W2 is substantially a curved surface. The outer sidewall W2 at least includes a round portion near the boundary line B1 and may include a flat portion connected to the length portion L1.

Referring to FIG. 9E, in some embodiments, the boundary line B1 is upright and parallel to the normal axis Z1. That is, the angle between the boundary line B1 and the normal axis Z1 is substantially 0 degrees. In such embodiments, the inner sidewall W1 has a rectangular shape, and the outer sidewall W2 is substantially upright.

Referring to FIG. 9F, in some embodiments, the boundary line B1 is slanted and apart from the normal axis Z1, That is, an inclination angle α greater than 0 degrees may exist between the boundary line B1 and the normal axis Z1. In such embodiments, the inner sidewall W1 has a trapezoid shape and the outer sidewall W2 is at least partially inclined. In some embodiments, the outer sidewall W2 includes a bevel portion around the boundary line B1.

Figure 9G:
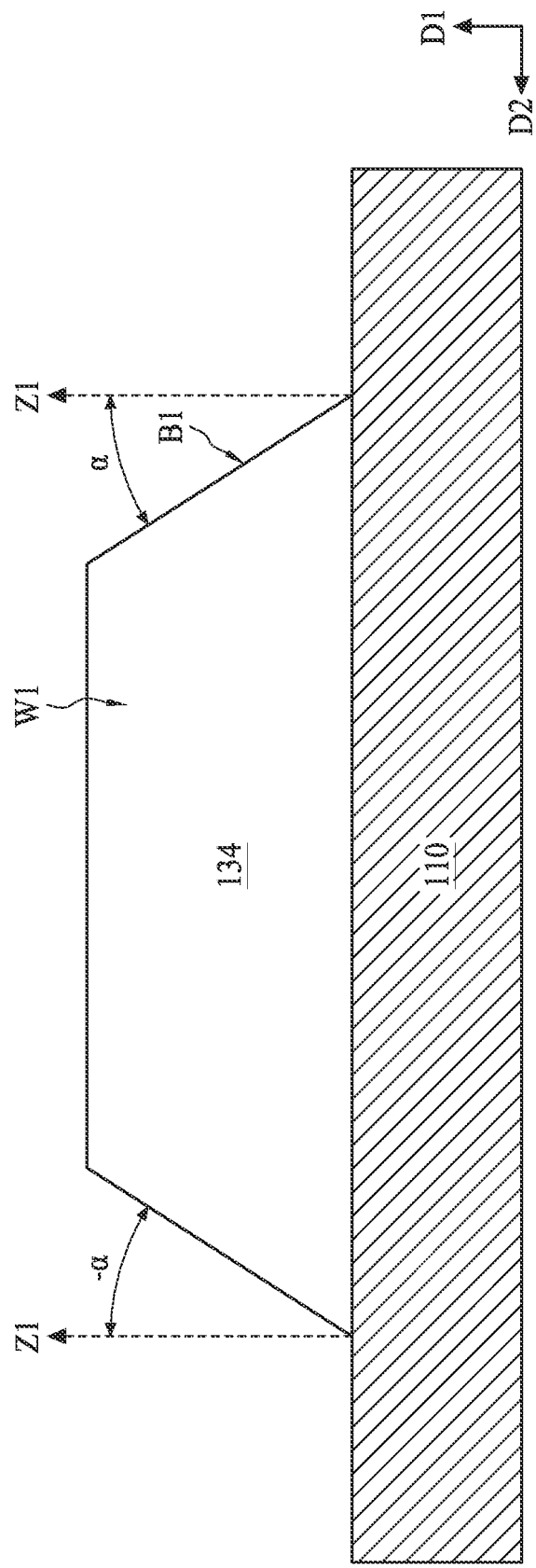

FIG. 9G is a schematic cross-sectional view taken along line C-C' shown in FIG. 9A. The spacer feature 134 may have a pair of boundary lines B1 at two ends of the inner sidewall W1. In some embodiments, the inclination angle α between the boundary line B1 and the normal axis Z1 is between about −60 to about +60 degrees. The minus sign of the "−60 degrees" may refer to the inclination angle α measured in a counterclockwise direction from the normal axis Z1, and the plus sign of the "+60 degrees" refers to the inclination angle α measured in a clockwise direction from the normal axis Z1. In some other embodiments, the minus sign of the "−60 degrees" may refer to the inclination angle α measured in a clockwise direction from the normal axis Z1, and the plus sign of the "+60 degrees" refers to the inclination angle α measure in a counterclockwise direction from the normal axis Z1. In some embodiments, when one end of the inner sidewall W1 corresponds to an inclination angle of +α, the other end of the inner sidewall W1 corresponds to an inclination angle of −α, and vice versa.

The present disclosure uses an SADP technology in accompany with a directional etching operation to cut spacer patterns into a pair of spacer features, which can save a lithographic process. With the use of the directional etching operation, a photomask and lithography operations used to form a photoresist pattern that protect the length portions L1 and expose the width portions R1 of the spacer patterns 132 are saved. As a result, the manufacturing process can be simplified and the process cost can be reduced.

Figure 10A:
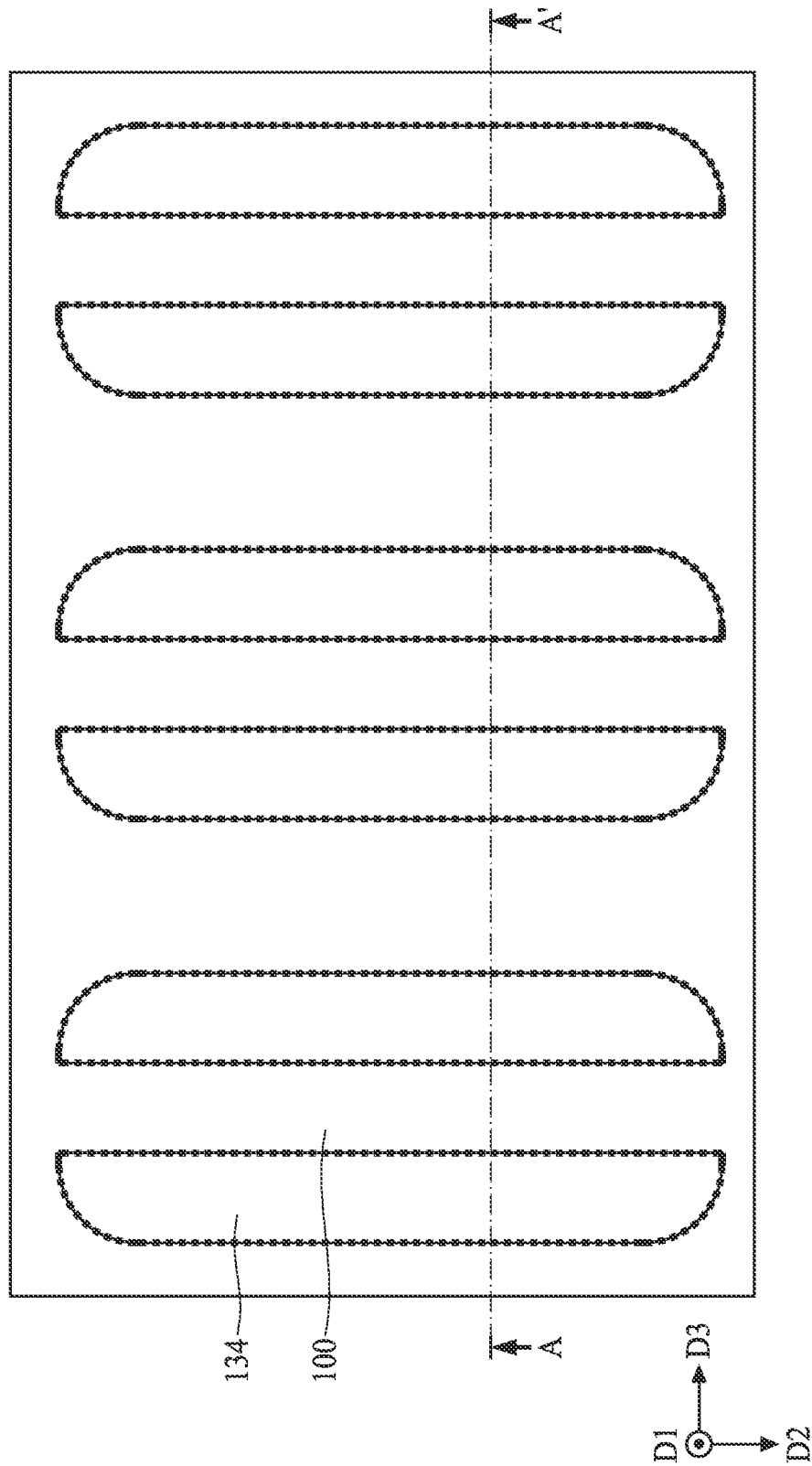
Figure 10B:
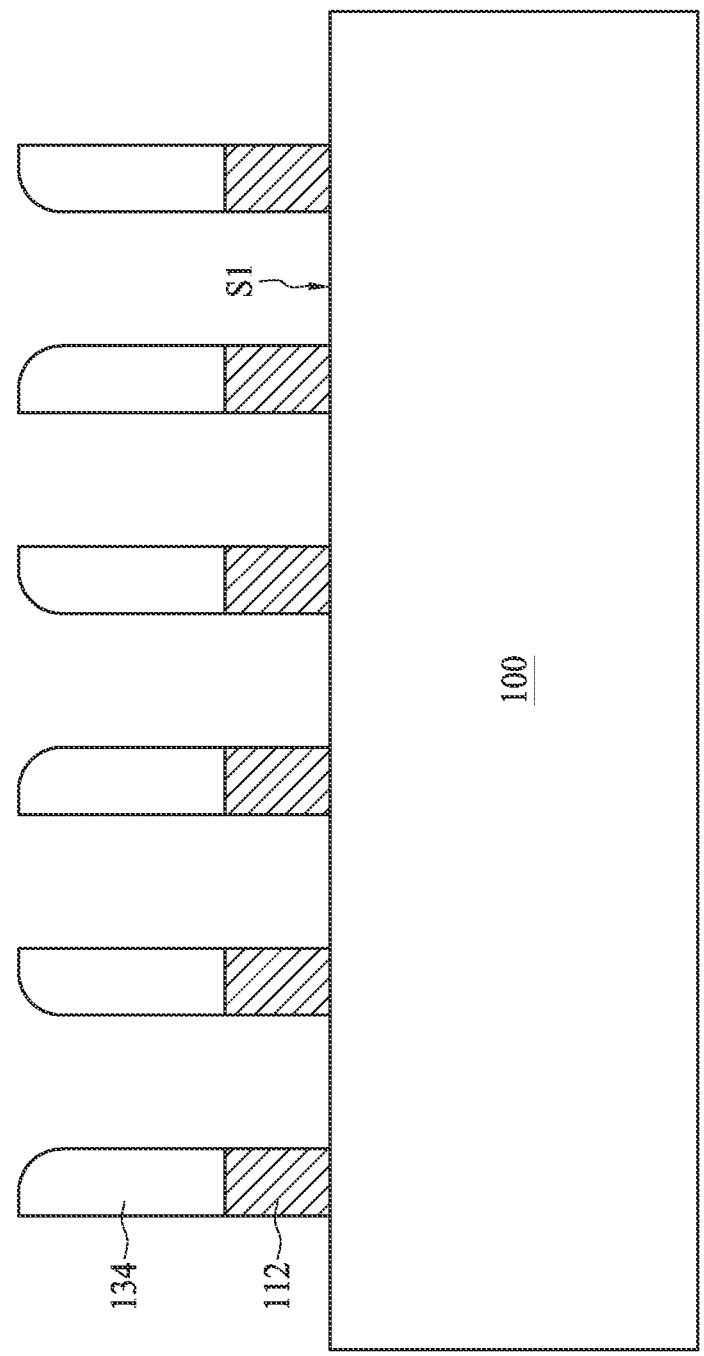

In operation 213, the mask layer 110 of the stacked structure 101 is patterned, as shown in FIGS. 10A and 10B. In some embodiments, the mask layer 110 is etched using the spacer features 134 as an etch mask. In some embodiments, the underlying substrate 100 acts as an etch stop layer during the patterning of the mask layer 110. After the patterning process, portions of the mask layer 110 are removed and portions of the top surface S1 are exposed. The remaining portion of the mask layer 110 forms multiple mask patterns 112 over the substrate 100.

Figure 11A:
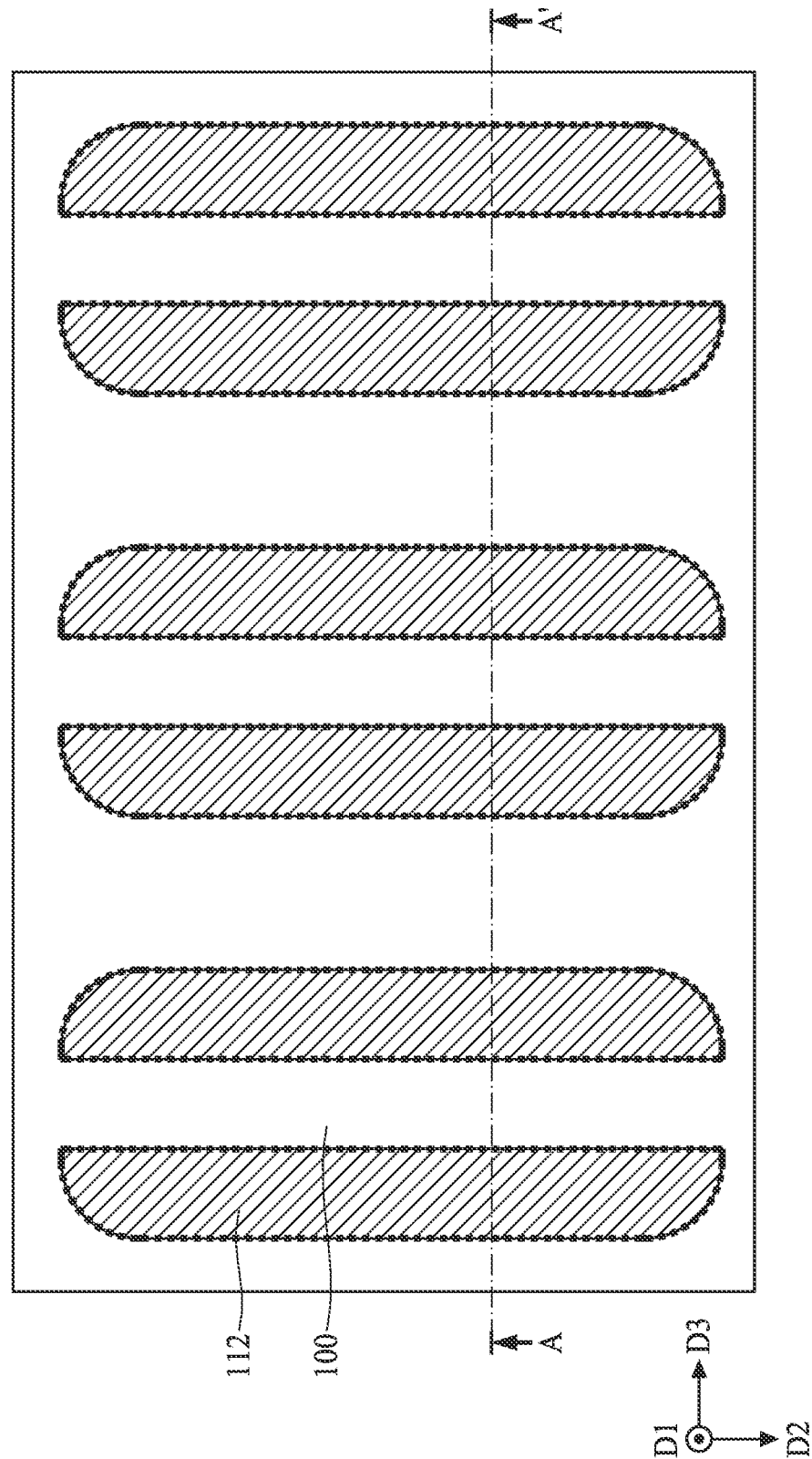
Figure 11B:
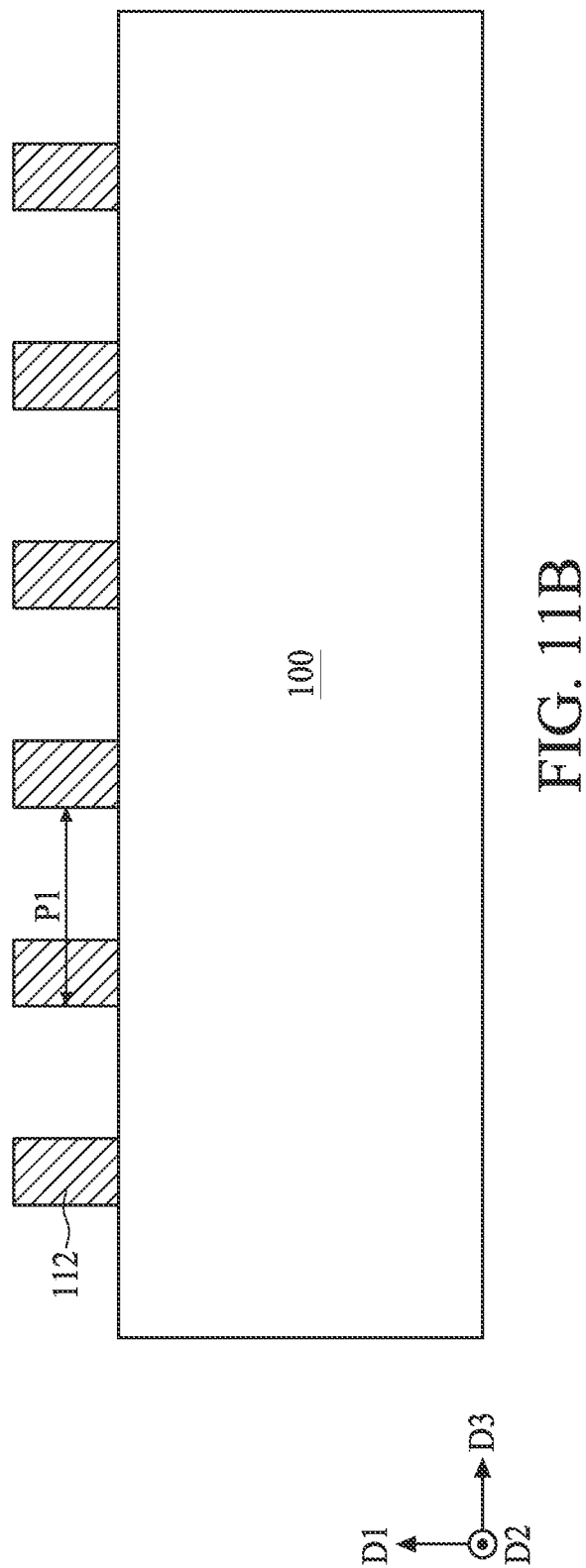

In operation 215, the spacer features 134 are removed, as shown in FIGS. 11A and 11B. An etching process may be used to remove the spacer features 134 and leave the mask patterns 112 on the substrate 100. In some embodiments, the spacer features 134 are differentiated from the mask patterns 112 and the substrate 100 in terms of an etching selectivity of the same etchant. The etching process may be selective to the spacer features 134 and do not remove (or substantially do not remove) the mask patterns 112 and the substrate 100. Therefore, the spacer features 134 can be completely removed while the mask patterns 112 and the substrate 100 are kept substantially intact after the etching process.

As illustrated in FIG. 11B, after the spacer features 134 are removed, each of the mask patterns 112 is formed on the substrate 100 and extend along the length direction D2. In some embodiments, the mask patterns 112 are parallel arranged along the width direction D3. Referring to FIGS. 9C and 11B, the pitch P1 of the spacer features 134 may be provided as the pitch of the mask patterns 112.

Figure 12A:
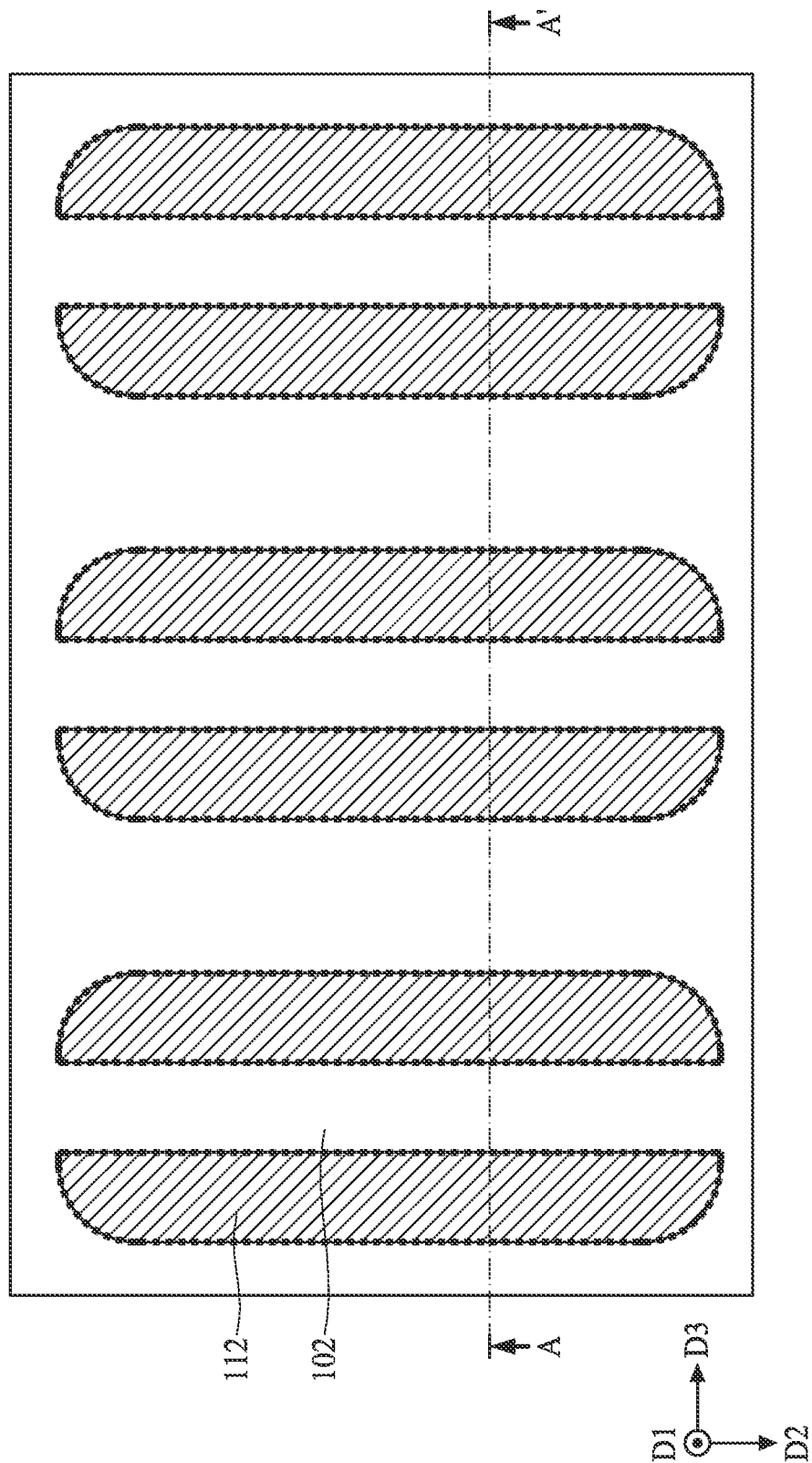
Figure 12B:
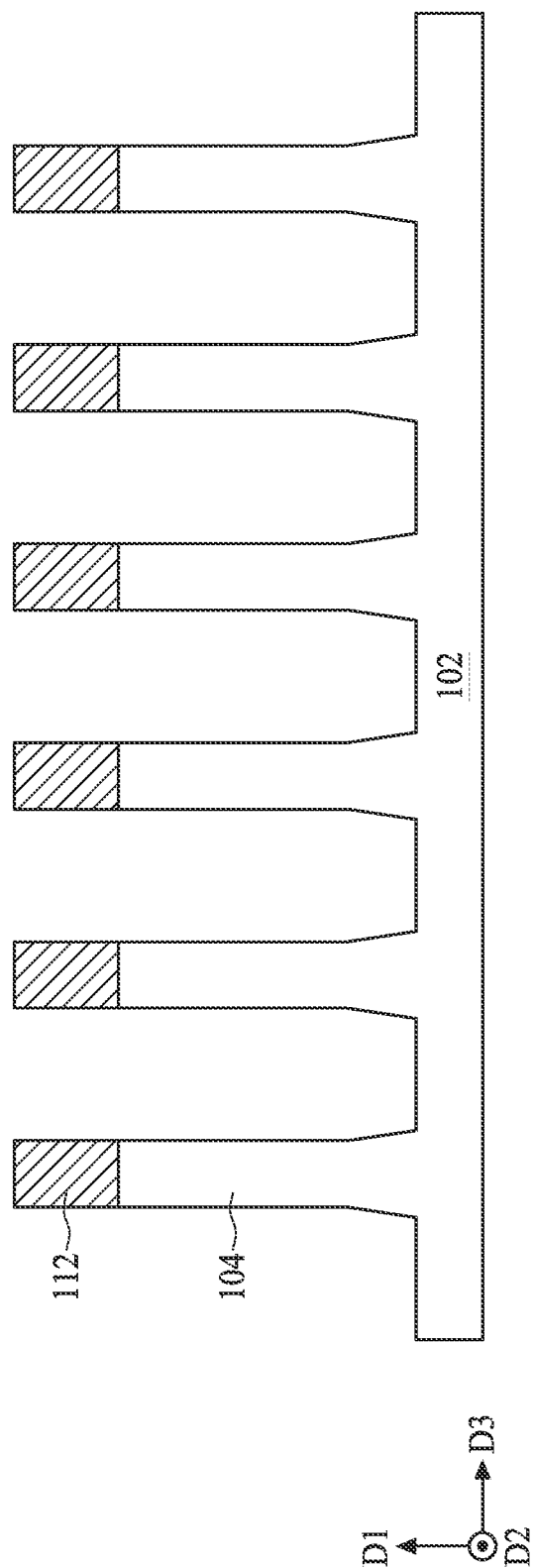

In operation 217, the substrate 100 is patterned, as shown in FIGS. 12A and 12B, In some embodiments, the substrate 100 is etched using the mask patterns 112 as an etch mask. After the patterning process, portions of the substrate 100 are removed and the remaining substrate 100 forms a substrate 102. As illustrated in FIG. 12B, in some embodiments, the substrate 102 includes multiple protruding fin patterns 104. The fin patterns 104 are respectively covered by the mask patterns 112.

In operation 219, the mask patterns 112 are removed, as shown in FIGS. 13A and 13B. An etching process may be used to remove the mask patterns 112 and leave the substrate 102. In some embodiments, the mask patterns 112 are differentiated from the substrate 102 in terms of an etching selectivity of the same etchant. The etching process may be selective to the mask patterns 112 and do not remove (or substantially do not remove) the substrate 102. Therefore, the mask patterns 112 can be completely removed while the substrate 102 are kept substantially intact after the etching process. As illustrated in FIG. 13B, in some embodiments, the fin patterns 104 extend along the length direction D2 and are arranged in parallel along the width direction D3. In some embodiments, a trench H1 is formed between two adjacent fin patterns 104 from a cross-sectional view. Multiple trenches H1 may be arranged between the fin patterns 104.

In operation 221, a dielectric layer 140 is deposited onto the substrate 102, as shown in FIGS. 14A and 14B. In some embodiments, the material of the dielectric layer 140 includes oxide, nitride, oxynitride, carbide, a combination thereof, or the like. The dielectric layer 140 may be formed using a deposition process such as CVD.

In some embodiments, the trench H1 is not completely filled with the dielectric layer 140. The fin patterns 104 may protrude from the dielectric layer 140. In other embodiments, the trench H1 is completely filled with the dielectric layer 140. As a result, the semiconductor structure 300 formed using the method 200 has been fabricated.

Figure 15A:
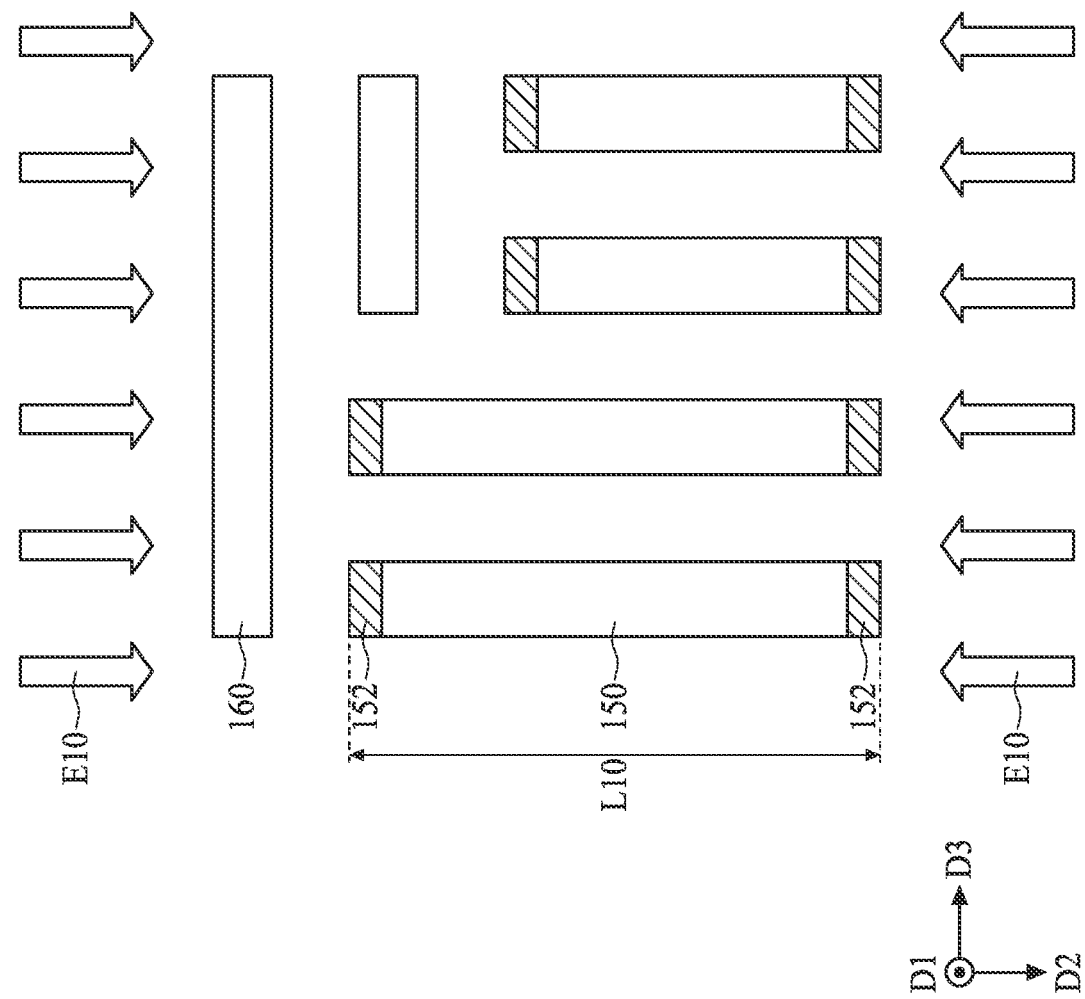

In some embodiments, multiple directional etching operations are used in the method 200. One or more of these directional etching operations may be used to trim a target pattern or remove a sacrificial pattern that is otherwise removed by another operation. FIGS. 15A and 15B are schematic top views illustrating various applications of the directional etching operation. Referring to FIG. 15A, multiple target patterns 150 may be arranged in parallel along the width direction D3 and over a substrate (not shown). Each of the target patterns 150 extends along the length direction D2. In some embodiments, the target patterns 150 are spacer patterns, mask patterns, fins of FinFETs or the like. The target patterns 150 may have a first length L10. Multiple sacrificial patterns 160 may be disposed near end portions of the target patterns 150. Each of the sacrificial patterns 160 extends along the width direction D3.

In some embodiments, a directional etching operation E10 is applied to the target patterns 150 along the length direction D2. The directional etching operation E10 may at least include two single etching operations with respective etching directions. Either etching operation can be applied downwards or upwards to the target patterns 150 from a top-view perspective. As illustrated in FIG. 15A, all of the sacrificial patterns 160 may receive most of the ion bombardments of the directional etching operation E10 since each sacrificial patterns 160 is substantially orthogonal to an incident direction the directional etching E10. After receiving a significant amount of ion treatments or plasma bombardment of the directional etching operation E10, all of the sacrificial patterns 160 may be removed, as shown in FIG. 15B. The removal of the sacrificial patterns 160 does not require any additional lithographic process. Since there is no need to use any photomask or photoresist, the processing cost can be greatly reduced.

Further, two ends 152 of each target patterns 150 may receive part of the directional etching operation E10. The two ends 152 may be partially or completely removed at the same time as the sacrificial patterns 160 are removed. Therefore, the target patterns 150 can be trimmed. Referring to FIG. 14B, after the directional etching operation E10, the remaining portion of the target pattern 150 may have a second length L20 substantially less the first length L10. In some embodiments, the trimmed ends of the target patterns 150 have a sharp corner or a round corner from a top-view perspective.

FIGS. 16A, 16B, 17A, 17B, 18A and 18B are schematic top views illustrating multiple directional etching operations applied in the method 200.

Figure 16A:
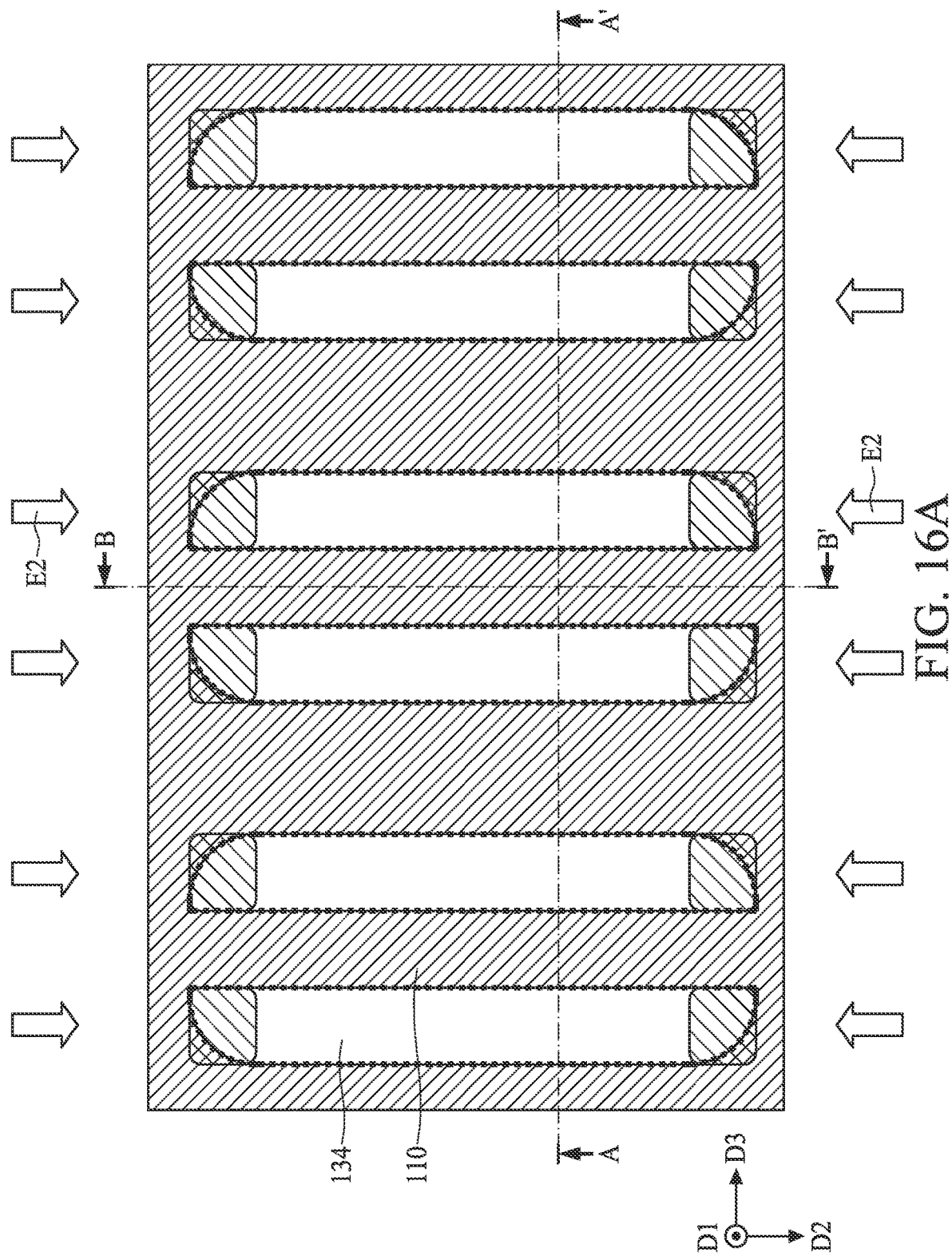
Figure 16B:
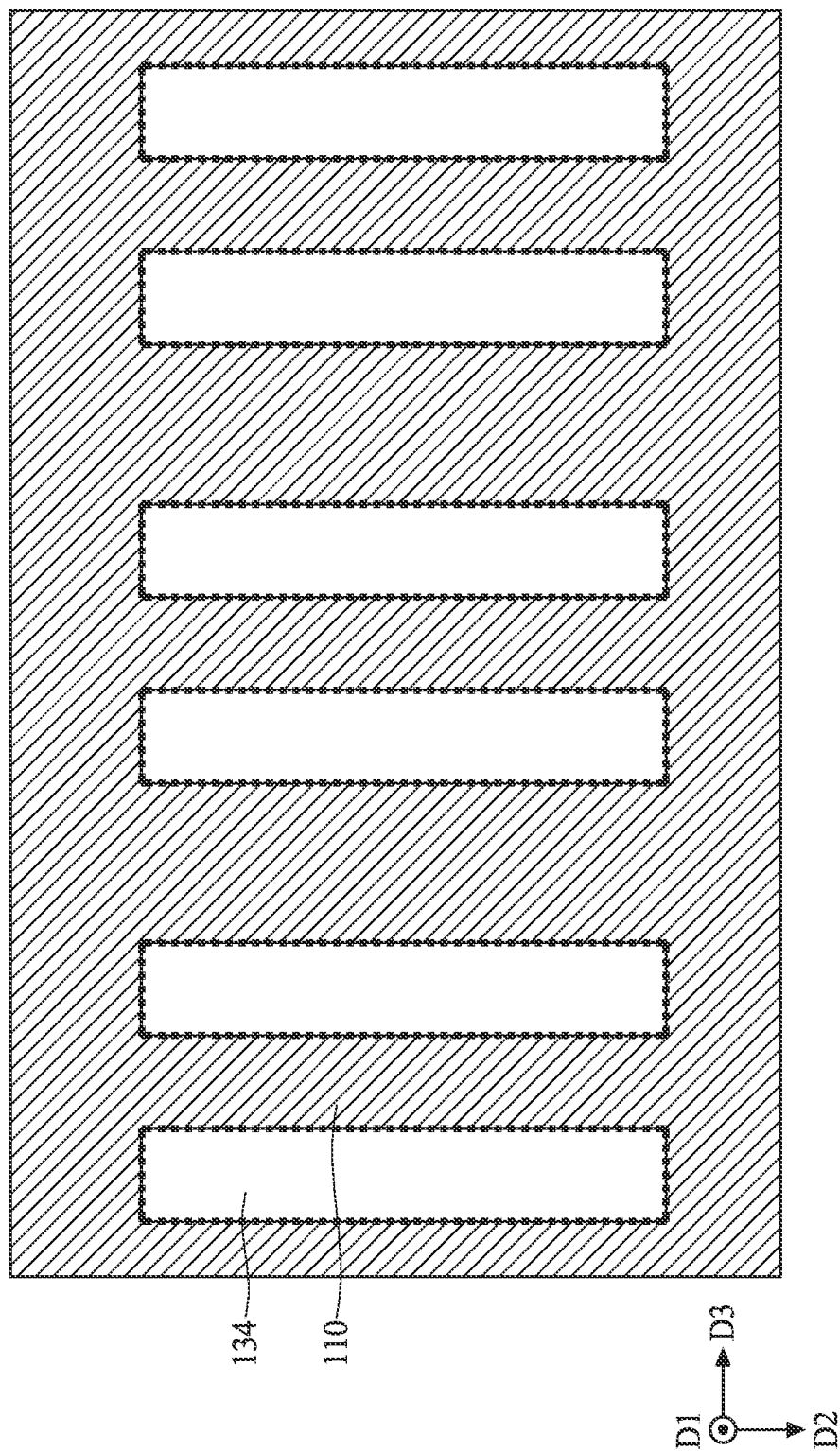

Continued from FIG. 9A and referring to FIG. 16A, in some embodiments, the method 200 further includes a second directional etching operation E2 performed on the spacer features 134 between operation 211 and operation 213. The second directional etching operation E2 may at least include two single etching operations with respective etching directions. Either etching operation can be applied downwards or upwards to the spacer features 134 from a top-view perspective. In some embodiments, the second directional etching operation E2 includes a slanted plasma etching. The tilt angle of the plasma may be controlled based on a desired etching profile so as to adjust the etching direction. In some embodiments, the second directional etching operation E2 is applied to the spacer features 134 along the length direction D2. Two ends (marked as dashed boxes) of each spacer features 134 may be at least partially removed. Therefore, the spacer features 134 can be trimmed to have a desired length, as shown in FIG. 16B, prior to subsequent operations. In some embodiments, the trimmed ends of the spacer feature 134 have a sharp corner or a round corner from a top-view perspective.

Figure 17A:
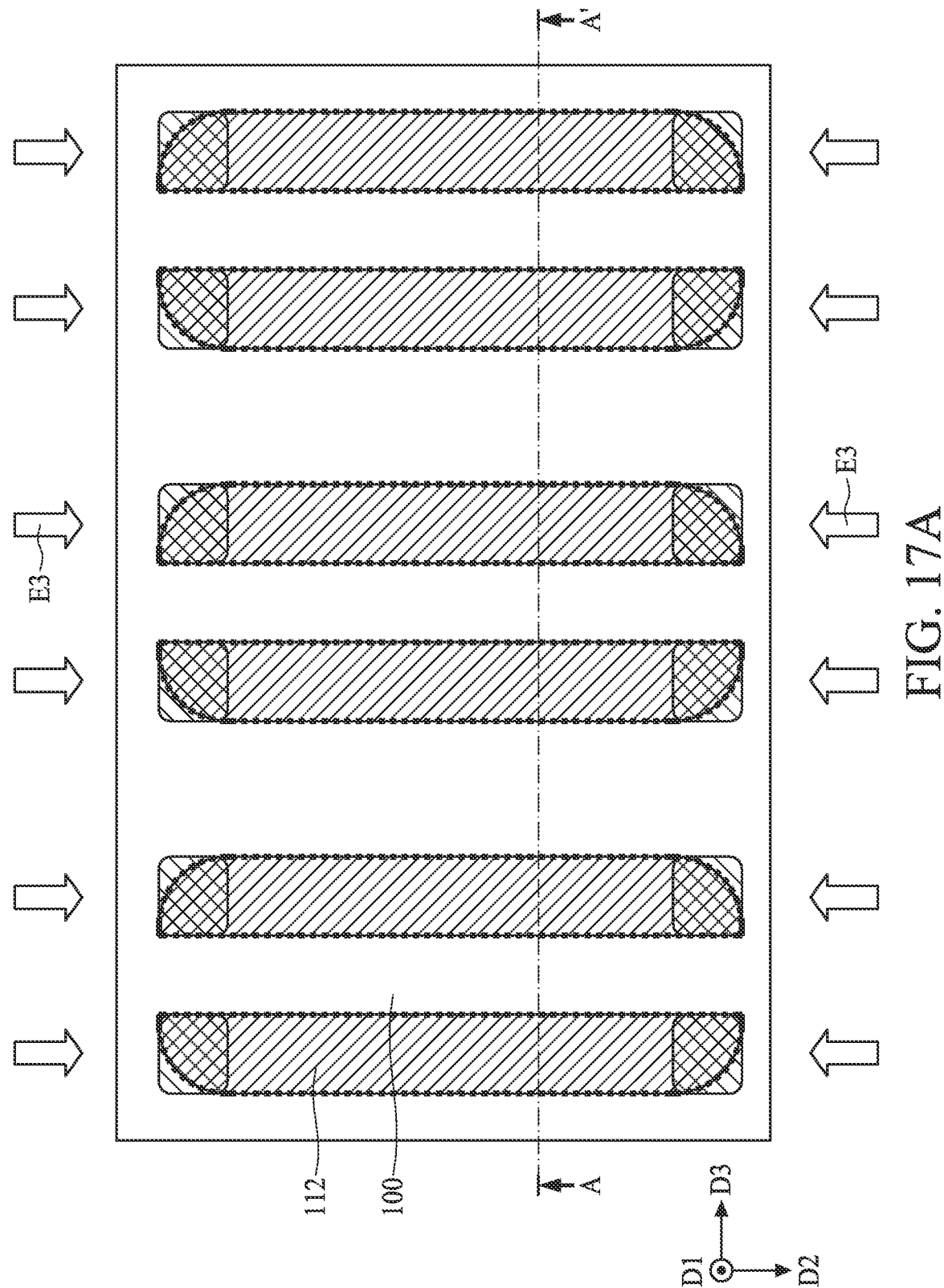
Figure 17B:
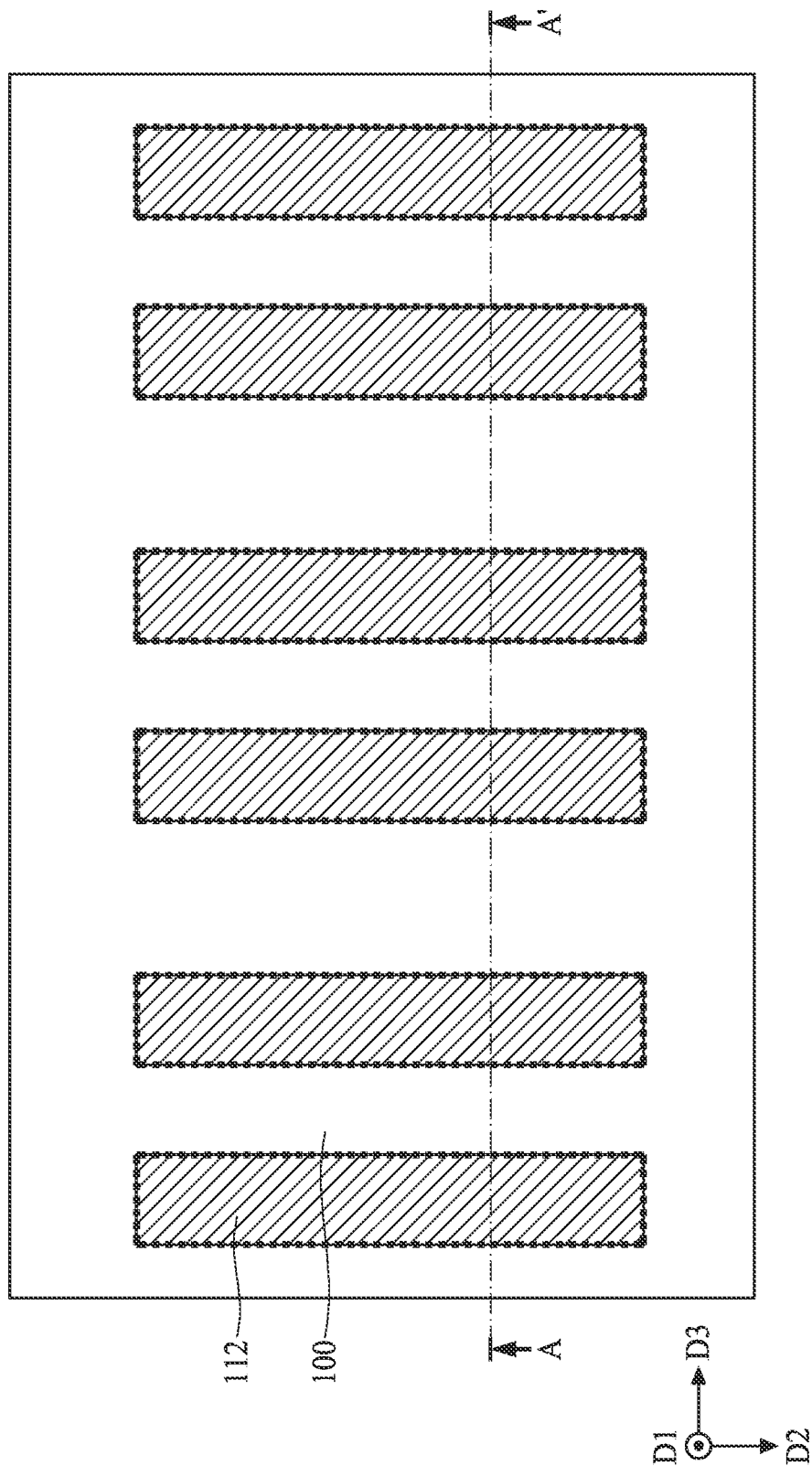

Continued from FIG. 11A and referring to FIG. 17A, in some embodiments, the method 200 further includes a third directional etching operation E3 performed on the mask patterns 112 between operation 215 and operation 217. The third directional etching operation E3 may at least include two single etching operations with respective etching directions. Either operation can be applied downwards or upwards to the mask patterns 112 from a top-view perspective. In some embodiments, the third directional etching operation E3 includes a slanted plasma etching. The tilt angle of the plasma may be controlled based on a desired etching profile so as to adjust the etching direction. In some embodiments, the third directional etching operation E3 is applied to the mask patterns 112 along the length direction D2. Two ends (marked as dashed boxed) of each mask patterns 112 may be at least partially removed. Therefore, the mask patterns 112 can be trimmed to have a desired length, as shown in FIG. 17B, prior to subsequent operations. In some embodiments, trimmed ends of the mask patterns 112 have a sharp corner or a round corner from a top-view perspective.

Figure 18A:
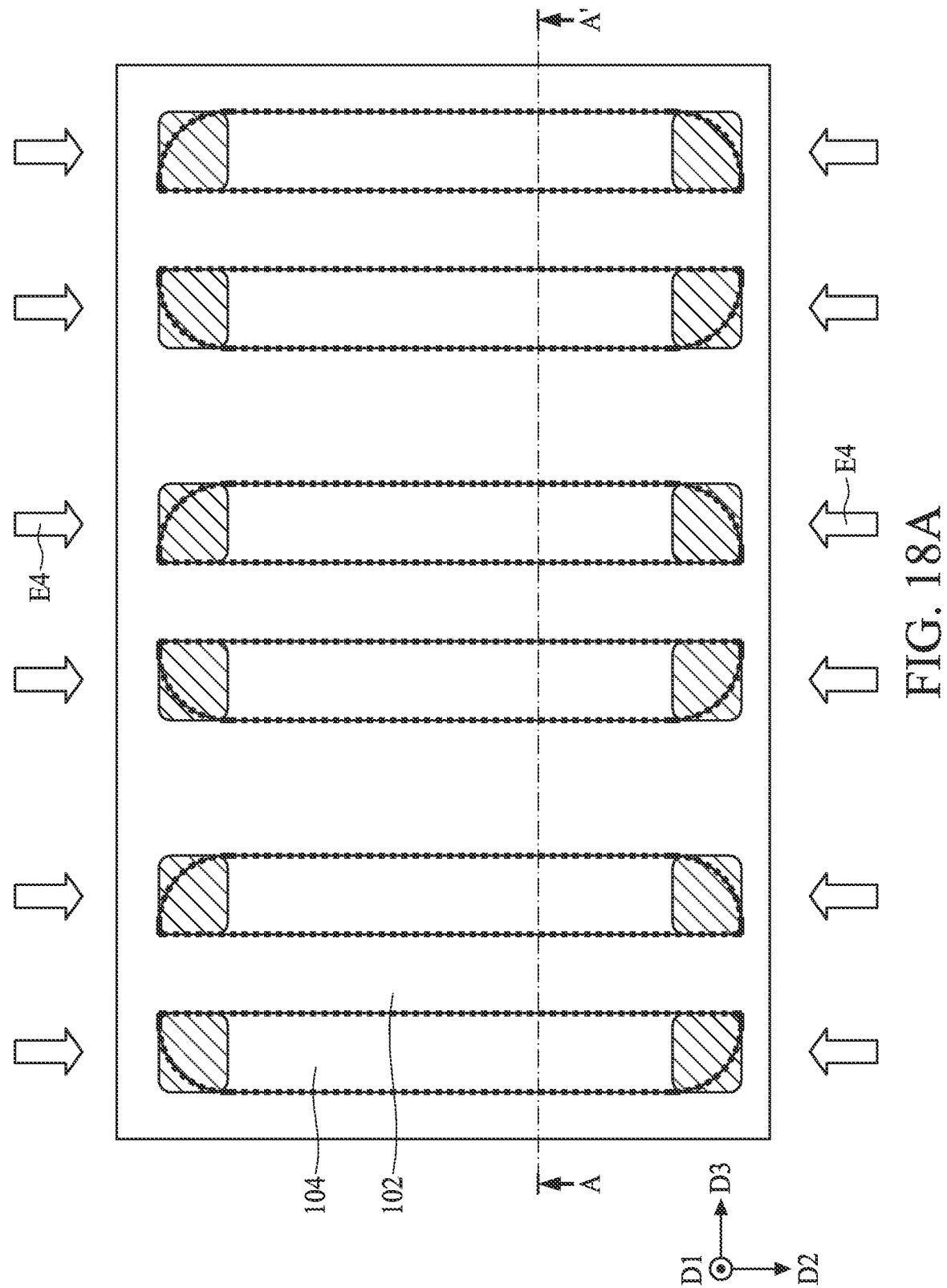

Continued from FIG. 13A and referring to FIG. 18A, in some embodiments, the method 200 further includes a fourth directional etching operation E4 performed on the fin patterns 104 between operation 219 and operation 221. The fourth directional etching operation E4 may at least include two etching operations with respective etching directions. Either operation can be applied downwards or upwards to the fin patterns 104 from a top-view perspective. In some embodiments, the fourth directional etching operation E4 includes a slanted plasma etching. The tilt angle of the plasma may be controlled based on a desired etching profile so as to adjust the etching direction. In some embodiments, the fourth directional etching operation E4 is applied to the fin patterns 104 along the length direction D2. Two ends (marked as dashed boxes) of each fin patterns 104 may be at least partially removed. Therefore, the fin patterns 104 can be trimmed to have a desired length, as shown in FIG. 18B, prior to subsequent operations. In some embodiments, the trimmed ends of the fin patterns 104 have a sharp corner or a round corner from a top-view perspective.

The directional etching operations E2, E3 and E4 do not require any lithographic process. As a result, the trimming of spacer features 134, mask patterns 112 or fin patterns 104 does not need any photomask or photoresist, and thus the processing cost can be greatly reduced. It is noted that one or more of the directional etching operations E2, E3 and E4 may be optional. Therefore, each of the directional etching operations E2, E3 and E4 may be used in accompany with the use of the directional etching operation E1.

One aspect of the present disclosure provides a method of manufacturing a semiconductor structure. The method includes providing a substrate; depositing a mask layer over the substrate; forming a mandrel pattern over the mask layer; forming a spacer pattern around the mandrel pattern; removing the mandrel pattern; and applying at least one directional etching operation along a first direction to etch two opposing ends of the spacer pattern and form a first spacer feature and a second spacer feature apart from each other.

One aspect of the present disclosure provides another method of manufacturing a semiconductor structure. The method includes providing a substrate; forming a mask layer over the substrate; forming a mandrel pattern over the mask layer, wherein the mandrel pattern extends along a first direction; forming a spacer pattern around the mandrel pattern; removing the mandrel pattern to form an opening defined by the spacer pattern, wherein the spacer pattern has a closed contour; and applying a directional etching operation along the first direction to etch two opposing sidewalls of the spacer pattern.

One aspect of the present disclosure provides another method of manufacturing a semiconductor structure. The method includes providing a substrate; forming at least one target pattern on the substrate, wherein the at least one target pattern extends along a first direction; forming at least one sacrificial pattern adjacent to the at least one target pattern, wherein the at least one sacrificial pattern extends along a second direction perpendicular to the first direction; and applying a directional etching operation along the first direction to trim two ends of the at least one target pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   providing a substrate;
   depositing a mask layer over the substrate;
   forming a mandrel pattern over the mask layer;
   forming a spacer pattern around the mandrel pattern;
   removing the mandrel pattern; and
   applying at least one directional etching operation along a first direction to etch two opposing ends of the spacer pattern and form a first spacer feature and a second spacer feature apart from each other.

2. The method of claim 1, wherein the forming the spacer pattern around the mandrel pattern comprises:
   depositing a spacer layer to cover an upper surface and sidewalls of the mandrel pattern; and
   removing portions of the spacer layer to expose a top surface of the mandrel pattern and a top surface of the mask layer.

3. The method of claim 1, further comprising:
   patterning the mask layer using the first spacer feature and the second spacer feature as a first etch mask to form a mask pattern;
   patterning the substrate using the mask pattern as a second etch mask to form a fin pattern; and
   depositing a dielectric layer in the target pattern.

4. The method of claim 1, wherein the first spacer feature and the second spacer feature are symmetrical from a top-view perspective.

5. The method of claim 1, wherein the first spacer feature and the second spacer feature are arranged along a second direction perpendicular to the first direction.

6. The method of claim 1, wherein the at least one directional etching operation includes a first etching operation, during which a first plasma is configured with a first tilt angle to bombard an exterior side of a first end of the spacer pattern and an interior side of a second end of the spacer pattern.

7. The method of claim 1, wherein the at least one directional etching operation includes a second etching operation, during which a second plasma is configured with a second tilt angle to bombard an interior side of the first end of the spacer pattern and an exterior side of the second end of the spacer pattern.

8. The method of claim 1, wherein the applying of the at least one directional etching operation includes performing a slanted plasma etching.

9. A method of manufacturing a semiconductor structure, comprising:
   providing a substrate;
   forming a mask layer over the substrate;
   forming a mandrel pattern over the mask layer, wherein the mandrel pattern extends along a first direction;
   forming a spacer pattern around the mandrel pattern;
   removing the mandrel pattern to form an opening defined by the spacer pattern, wherein the spacer pattern has a closed contour; and
   applying a directional etching operation along the first direction to etch two opposing sidewalls of the spacer pattern.

10. The method of claim 9, wherein the opening is elongated during the applying of the directional etching operation.

11. The method of claim 9, wherein the substrate includes an active region, a dielectric layer or a metal line.

12. The method of claim 9, wherein the applying of the directional etching operation breaks the closed contour of the spacer pattern along the first direction into a pair of spacer features.

13. The method of claim 12, wherein the pair of spacer features includes a flat inner sidewall and a curved outer sidewall connected to the inner sidewall via a boundary line.

14. The method of claim 13, wherein the inner sidewall has a rectangular or trapezoid shape.

15. The method of claim 13, wherein the outer sidewall is at least partially inclined.

16. The method of claim 13, wherein the boundary line is slanted from a normal axis orthogonal to both the first direction and the second direction by an inclination angle between about −60 to about +60 degrees.

17. A method of manufacturing a semiconductor structure, comprising:
   providing a substrate;
   forming at least one target pattern on the substrate, wherein the at least one target pattern extends along a first direction;
   forming at least one sacrificial pattern adjacent to the at least one target pattern, wherein the at least one sacrificial pattern extends along a second direction perpendicular to the first direction; and
   applying a directional etching operation along the first direction to trim two ends of the at least one target pattern.

18. The method of claim 17, wherein the applying of the directional etching operation removes the at least one sacrificial pattern.

19. The method of claim 17, wherein the two ends of the least one target pattern after being trimmed have a sharp corner or a round corner from a top-view perspective.

20. The method of claim 17, wherein the least one target pattern includes at least one of a spacer pattern, a mask pattern and a fin pattern.

* * * * *